United States Patent [19]
Whetsel

[11] Patent Number: 5,576,980
[45] Date of Patent: Nov. 19, 1996

[54] SERIALIZER CIRCUIT FOR LOADING AND SHIFTING OUT DIGITIZED ANALOG SIGNALS

[75] Inventor: Lee D. Whetsel, Plano, Tex.

[73] Assignee: Texas Instruments Incorporated, Dallas, Tex.

[21] Appl. No.: 193,616

[22] Filed: Feb. 8, 1994

Related U.S. Application Data

[63] Continuation of Ser. No. 723,349, Jun. 28, 1991, abandoned.

[51] Int. Cl.[6] .................................................. G05B 23/00
[52] U.S. Cl. ........................ 364/579; 364/580; 341/100; 341/101; 371/22.3
[58] Field of Search ................................ 341/101, 120, 341/100; 371/15.1, 16.1, 22.3; 324/73.1; 364/579, 580; 330/252, 69

[56] References Cited

U.S. PATENT DOCUMENTS

| | | | |
|---|---|---|---|
| 3,863,226 | 1/1975 | Ryburn | 341/100 |
| 4,309,767 | 1/1982 | Andow et al. | 341/120 |
| 4,350,973 | 9/1982 | Petryk, Jr. | 341/101 |
| 4,429,300 | 1/1984 | Yamasawa et al. | 341/101 |
| 4,588,986 | 5/1986 | Byrne | 341/100 |
| 4,639,664 | 1/1987 | Chiu et al. | 324/73.1 |
| 4,698,599 | 10/1987 | Hedman | 330/69 |
| 4,710,922 | 12/1987 | Scott | 341/100 |
| 4,760,377 | 7/1988 | Jackson | 341/101 |
| 4,763,066 | 8/1988 | Yeung et al. | 324/73 R |
| 4,814,721 | 3/1989 | Zana et al. | 330/69 |
| 4,831,558 | 5/1989 | Shoup et al. | 364/550 |
| 4,885,584 | 12/1989 | Dalrymple | 341/101 |
| 4,897,650 | 1/1990 | Shott, III et al. | 341/120 |
| 4,897,837 | 1/1990 | Ishihara et al. | 371/22.3 |
| 4,901,076 | 2/1990 | Ashin et al. | 341/101 |
| 4,903,024 | 2/1990 | Evans et al. | 341/120 |
| 4,937,575 | 6/1990 | Kummer | 41/120 |
| 4,999,627 | 3/1991 | Agazzi | 341/120 |
| 5,001,713 | 3/1991 | Whetsel | 371/22.3 |
| 5,042,034 | 8/1991 | Correale, Jr. et al. | 371/22.3 |
| 5,054,024 | 10/1991 | Whetsel | 371/22.3 |
| 5,063,383 | 11/1991 | Bobba | 324/73.1 |
| 5,070,305 | 12/1991 | Confalonieri et al. | 330/69 |
| 5,107,264 | 4/1992 | Novof | 341/101 |
| 5,130,988 | 7/1992 | Wilcox et al. | 371/22.3 |
| 5,153,882 | 10/1992 | Lyon et al. | 371/22.3 |
| 5,175,819 | 12/1992 | Le Ngoc et al. | 341/101 |
| 5,214,655 | 5/1993 | Eichelberger et al. | 371/22.3 |
| 5,228,045 | 7/1993 | Chiles | 371/22.3 |
| 5,247,652 | 9/1993 | Uda | 341/101 |

Primary Examiner—Emanuel T. Voeltz
Assistant Examiner—Hal D. Wachsman
Attorney, Agent, or Firm—Mark E. Courtney; Wade James Brady, III; Richard L. Donaldson

[57] ABSTRACT

A transmitter test circuit (40) for serially transmitting multiple packets of digitized analog signals comprises translation circuitry in the form of analog-to-digital interface (142) that translates an analog signal into a digital representation of the analog signal. The digital representations comprise a plurality of binary bit positions. A shift register (200) receives and outputs the digital representations. The load/shift control bus operates between the shift register or PSA/sample register (200) and a serializer circuit (204) for loading the digital representations into the shift register (200). Output circuitry shifts the digital representations out of the shift register to an intermediate integrated circuit (43) and on to a test bus controller (44). Test bus controller (44) includes input/output circuitry (61), a memory (59), a processor (63) registers (45 and 47) and a test port controller (71). Test bus controller (44) may output to a plurality of external test port devices.

26 Claims, 7 Drawing Sheets

SINGLE INPUT MODE: Vout=(GAIN)(V1)
DIFFERENTIAL MODE: Vout=(GAIN)(V1−V2)

SERIALIZER CIRCUIT FOR LOADING AND SHIFTING OUT DIGITIZED ANALOG SIGNALS

This application is continuation of application Ser. No. 07/723,349, filed Jun. 28, 1991 now abandoned.

TECHNICAL FIELD OF THE INVENTION

This invention relates in general to electronic circuits, and more particularly to a serializer circuit or transmitter test circuit for loading and shifting out digitized analog signals representing voltage amplitude measurements from an analog signal monitoring circuit for non-intrusive storing and processing of voltage amplitude measurements on analog signals.

BACKGROUND OF THE DISCLOSURE

Known test methods and systems for measuring and testing analog circuits on electronic circuit boards require the use of expensive external test equipment and signal node probing mechanisms. During test, the analog circuits operate together functionally while an external analog tester probes, stores and processes analog signals within the analog circuit. These external analog test systems do not provide the capability to easily monitor the analog signals while the analog circuitry operates normally in its system environment due to limited physical access to probe the circuit nodes. Moreover, known analog test methods are not easily useable during the entire life cycle of a functional circuit, i.e., during production test, system integration, system test, on-line test or diagnostics, and field support and maintenance.

A particular limitation associated with traditional analog test methods is that state of the art board designs are so densely populated with integrated circuits that physical probing of the analog signals is very difficult, if not impossible. Moreover, in traditional systems the necessity for external probes to make contact with the signal path often affects the analog signal. Probes add resistive and capacitive loads to an analog signal that potentially cause the signal characteristics (e.g., voltage amplitude and wave shape) to change when these systems take voltage measurements. As a result, physical probing of analog signals can produce inaccurate measurements and distort test results.

Yet another problem associated with traditional test methods is that these tests are dependent on the availability of external testers and probing fixtures. These systems usually include complex and cumbersome electronic circuits housed within various cabinets or component chassis. In a field environment, the transportation and upkeep of these components can be a very expensive proposition.

At an even more detailed level, even if a solution to the above problems were available, the most effective and efficient method to output multiple digitized analog patterns from any test circuit for these purposes is that provided by IEEE standard 1149.1. That standard, describes the execution of a data register scan cycle that can be used for analog signal monitoring operations and requires that for each digitized analog pattern monitored a complete data register scan cycle be performed. In each data register scan cycle, selection, data capture, data shifting, data updating, and other operations are necessary. If there were a way to eliminate the need to perform a complete data register scan cycle for each digitized analog pattern accessed, it may be possible to significantly decrease the amount of time taken to test each analog circuit.

Therefore, there is a need for an analog test method that does not rely on the availability of test equipment in a field environment.

There is a need for an analog signal testing method and circuit that does not include the resistive and capacitive loads that distort signal characteristics during testing.

There is a further need for an analog test method and circuit that efficiently uses a data register scan cycle for accessing digitized analog patterns during testing.

SUMMARY OF THE INVENTION

Accordingly, the present invention provides a serializer circuit for loading and shifting out digitized analog signals and overcomes the limitations of previous systems and satisfies the aforementioned needs.

According to one aspect of the present invention there is provided a serializer circuit for loading and shifting out multiple packets of digitized analog signals. The serializer circuit overcomes many of the operational limitations of the IEEE 1149.1 standard. The serializer circuit comprises translation circuitry that translates analog signals into their digital representation. The digital representations comprise a plurality of binary bit positions. A shift register receives and stores the digital representation and associates with load/shift control circuitry for loading the digital representations from the translation circuitry into the shift register and shifting the loaded digital representations out of the shift register and into a receiver test circuit. In the preferred embodiment, the receiver test circuit serially receives multiple packets of the digital representations from the serializer circuit by repeating the steps of, shifting in a predetermined number of the serial data bit positions into a shift register and storing the contents of the shift register in a parallel memory after the predetermined number of the serial bits have been received.

A technical advantage of the present invention is that instead of requiring a complete data register scan cycle for each digital representation accessed, the serializer circuit of the present invention requires only one extended IEEE 1149.1 data register scan operation for accessing a predetermined number of digital representations. In one example, the present invention provides as much as a 93% decrease in test time over the IEEE 1149.1 approach on an exemplary circuit. As a result of using the present invention analog testing methods may be significantly improved.

Another technical advantage of the present invention is that as opposed to requiring external test equipment and using highly resistive and capacitive external test probes, the serializer circuit of the present invention associates with an internal analog signal monitoring circuit and, as a result, may be utilized throughout the life cycle of an analog circuit for repeated testing in the field environment. Consequently, the serializer circuit of the present invention assists in decreasing the life cycle costs associated with test and maintenance of analog circuits in a product.

Yet another technical advantage of the present invention is that because the serializer circuit of the present invention may provide as much as a 93% or more increase in the sample rate of an analog signal, more information concerning a particular analog circuit may be obtained over a fixed period of time. As a result, for an individual circuit more processing and signal testing is possible. This permits more accurate diagnosis and analysis of analog signal flow in the analog circuit.

BRIEF DESCRIPTION OF THE DRAWINGS

For a more complete understanding of the present invention and the advantages thereof, reference is now made to the following descriptions taken in conjunction with the accompanying drawings, in which.

DETAILED DESCRIPTION OF THE INVENTION

The preferred embodiment of the present invention is best understood by referring to FIGS. 1–12 of the drawings, like numerals being used for like and corresponding parts of the various drawings.

Figure 1:
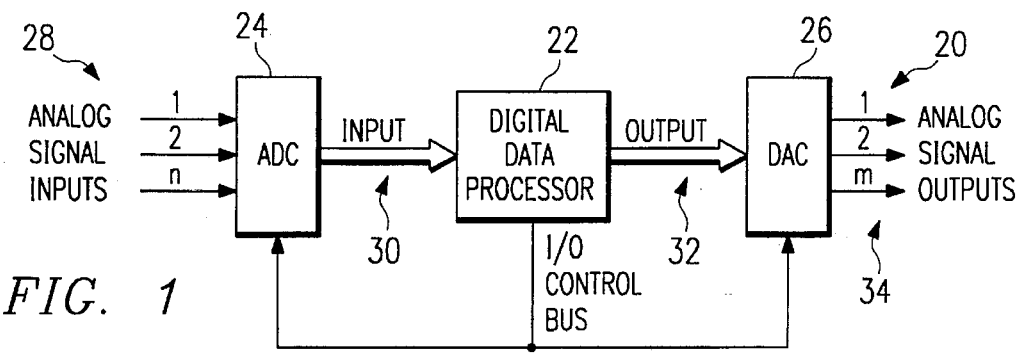
FIG. 1 illustrates a block diagram of an application of the present invention illustrating a generalized circuit consisting of a digital data processor, analog-to-digital converter (ADC), and a digital-to-analog converter (DAC)

FIG. 1 provides an example application of the preferred embodiment showing a generalized circuit 20 consisting of a digital data processor 22, analog-to-digital converter (ADC) 24, and a digital-to-analog converter (DAC) 26. The example illustrates how analog signals 28 can be received and translated into a digital format 30, digitally processed to correct any anomalies, then output 32 for translation back into an analog format and output 34 from circuit 20. The circuit 20 architecture allows analog signals (1, 2, ..., n) 28 to be input into the ADC 24, where they are converted into a digital representation of the voltage level of the received analog signals 28, then input 30 into data processor 22 for processing. After processing, circuit 20 allows the processed analog signals to be digitally output 32 from data processor 22 and into DAC 26. From DAC 26, output signals 32 are converted into an equivalent analog voltage representation and output from circuit 20 via one or more of the analog signal outputs (1, 2, ... m) 34. The operation of ADC 24 and DAC 26 is well known to those skilled in the art of analog and digital design.

The conventional method of testing circuits such as circuit 20 of FIG. 1 to insure proper operation is to probe the input 28 and output 34 analog signals using an oscilloscope or other type of analog measurement device. The loading effect of a probing instrument, however, can cause inaccurate measurements. Also, physical access is required to probe the circuit inputs and outputs. As a result, the circuit must be removed from the system that it supports for probe testing. Removing the circuit from the system disables the system function that the circuit provides.

In most high-end commercial and military applications, systems must remain on line, i.e. fully operational. These types of systems do not have the opportunity to be taken off line to allow their internal circuits to be accessed for testing purposes. Consequently, the system's internal circuits need to be tested while the system is operating. A need, therefore, has arisen for a method of allowing analog circuits, such as circuit 20 of FIG. 1, to be tested while operating normally in the system that they support. The preferred embodiment provides a methodology and test circuit that allow testing of active analog circuits embedded in a system design.

Figure 2:
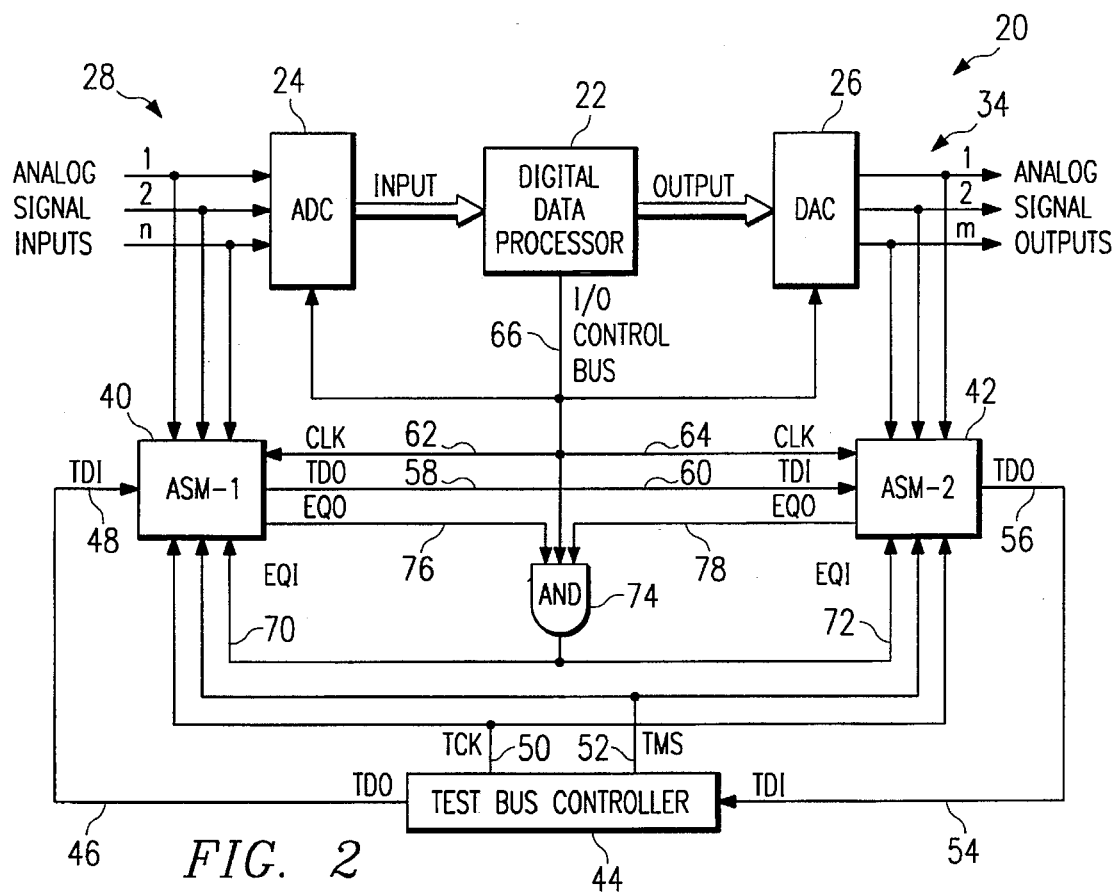
FIG. 2 shows two analog signal monitoring circuits according to the preferred embodiment of the present invention that have been added to the system circuit of FIG. 1 to provide monitoring of the analog input and output signals.

In FIG. 2, two analog signal monitoring (ASM) circuits 40 and 42 have been added to the system circuit 20 of FIG. 1 to provide monitoring of the analog signal inputs 28 and analog signal outputs 34. ASM-1 40 monitors the analog input signals (1, 2, ..., n) 28 to ADC 24 and ASM-2 42 monitors the analog signal outputs (1, 2, ... m) 34 from DAC 26. The ASM circuits 40 and 42 are connected to test bus controller 44 which may either be a local controller in the system circuit 20, a higher level system controller, an external controller that plugs into the system for test access, or a remote controller that connects up to the system via phone lines or electromagnetic transmission.

Test bus controller 44 outputs a test data output (TDO) signal 46 to the test data input (TDI) 48 of ASM-1 40, a test clock (TCK) signal 50 and test mode select (TMS) 52 signal to both ASM circuits 40 and 42, and receives a test data input (TDI) signal 54 from the test data output (TDO) 56 of ASM-2 42. In this configuration, test bus controller 44 can output control on its TMS 52 and TCK 50 signals to cause data to be shifted from the test bus controller TDO output 46, through ASM-1 40 from its TDI input 48 to its TDO output 58, through ASM-2 42 from its TDI input 60 to its TDO output 56, and back into test bus controller 44 via the TDI input 54. Test bus controller 44 uses the scan path through ASM-1 40 and ASM-2 42 to set up test monitor operations on the analog signals entering and leaving circuit 20 and to extract the test results stored in ASM circuits 40 and 42 for processing. The serial bus comprised of TDO, TMS, TCK, and TDI is described in detail in IEEE Standard 1149.1.

The ASM circuits 40 and 42 can receive control signals to execute a test monitoring operation from either test bus controller 44 via the TMS 52 and TCK 50 control signals or from a control circuit internal to each ASM circuit. When the ASMs are controlled by test bus controller 44, they receive control input on the TMS 52 and TCK 50 signals causing them to take a digitized sample of a selected analog signal input 28 and 34. After the digitized analog value(s) is sampled, test bus controller 44 outputs control to shift the data out of the ASM circuits and into test bus controller 44 for processing.

When the ASM circuit is controlled by its internal control circuit, multiple digitized samples of a selected analog input signal can be taken and either stored into an internal RAM memory and/or compressed into an internal signature analysis register. After the digitized analog values are stored and/or compressed, test bus controller 44 outputs control to shift the data or signature out of the ASM and into test bus controller 44 for processing.

An important difference between the two methods of test control, i.e., via test bus controller 44 or the ASM internal control circuit, is that the test performed by test bus controller 44 is asynchronous to the circuit under test, since it receives control from test bus controller 44, while the test performed by the ASM internal control circuit is synchronous to circuit 20, since it receives timing input from circuit 20.

During tests controlled by test bus controller 44, TMS 52 and TCK 50 signals control when digitized analog signal values are captured. The TMS 52 and TCK 50 signals are not synchronous with the operation of circuit 20. While test bus controller 44 is able to sample and shift out an analog measurement, the value shifted out has no relationship to the input or output timing of circuit 20.

When the circuit of FIG. 2 is being monitored using the ASM's internal control circuit, however, the clock (CLK) input 62 and 64 to the respective ASM-1 40 and ASM-42 is driven by the data processor 22 input/output control bus 66. Since the CLK input 62 or 64 drives the internal control circuit, referred to throughout the rest of this disclosure as event qualification module 68 (SEE FIG. 3) or EQM 68, the test is performed synchronous to the operation of circuit 20. In addition to being synchronous to circuit 20, EQM 68 can be qualified so that it knows when to sample an analog signal input 28. Qualification is important because sampling data synchronously, but at random (non-qualified) times, provides meaningless data.

EQM 68 can be qualified to perform a test monitor operation in one of three ways. The digitized analog signal inputs can be matched against being: (1) equal to a stored expected value, (2) greater than a stored expected value, (3) greater than or equal to a stored expected value, (4) less than a stored expected value, (5) less than or equal to a stored expected value, (6) less than or equal to the one stored expected value and greater than or equal to another stored expected value (i.e. within a window bounded by two digital number values), or (7) either greater than one stored expected value or less than another stored expected value (i.e. outside of a window bounded by two digital number values). The first qualification method is for the ASM to receive the analog input from circuit 20, convert it internally into a digital representation, compare the digital representation of the analog signal against a stored expected digital value, and input the compared result into EQM 68 for examination. When a compared signal input to EQM 68 indicates a match condition, EQM 68 outputs control to start storing or compressing the digitized analog signal inputs. After a test is started, EQM 68 can compare against another digitized analog input value to stop the test monitor operation.

The second qualification method is to receive an external digital signal into the event qualification input (EQI) pin 70 and 72 for ASM-1 40 and ASM-2 42, respectively. The EQM 68 can be set up to monitor the EQI pin 70 or 72, as appropriate. The EQI pin 70 or 72 to the ASM-1 40 or ASM-2 42 integrated circuits is driven by AND gate 74. AND gate 74 receives input from input/output control bus 66, and from event qualification output (EQO) pins 76 and 78 of ASM-1 40 and ASM-2 42, respectively. By setting the EQO outputs 76 and 78 to a logic one state, AND gate 74 can pass signals from input/output control bus 66 to EQI input 70 and 72. When a signal from input/output control bus 66 is input to the EQM 68 of each ASM, via the EQI pin 70 and 72, the EQM 68 outputs control to start a test monitor operation. While AND gate 74 is shown receiving input from input/output control bus 66, any number of other external inputs could be input to externally qualify ASM-1 40 and ASM-2 42 to start a test monitor operation. After a first external input starts the test, EQM 68 looks for a second external input to stop the test monitor operation. For clarity, it should be understood that each ASM-1 40 and ASM-2 42 comprises its own separate EQM 68.

The third qualification method involves a combination of the first two methods. To expand the event qualifying capability, EQM 68 inside ASM-1 40 and ASM-2 42 can output a signal indicating when a match is present between a digitized analog input and the stored expected data. When both EQMs 68 in ASM-1 40 and ASM-2 42 arrive at a match, EQMs 68 output a match signal on the respective EQO 76 and EQO 78 outputs. These match signals are combined with external digital signals input to AND gate 74 to produce a global qualification signal that is input to the ASM circuits via EQI inputs 70 and 72. When all inputs to AND gate 74 are high, AND gate 74 outputs a signal into EQI inputs 70 and 72 to start a test monitor operation. The ability to start a test monitor operation in response to a more global qualification input enhances the ASM circuits ability to measure analog signals at precise circuit 20 input/output times. After a first global external input starts the test monitor operation, EQM 68 looks for a second global external signal to stop the test monitor operation.

While AND gate 74 is shown in FIG. 2 as a means of combining external signal inputs into a single signal to be input to EQI input pins 70 and 72, other types of simple boolean functions (e.g., OR, NOR, or NAND) or other more complex boolean functions (e.g., AND-OR, NAND-OR, OR-AND, NOR-AND, etc.) may also be used. In addition, the combining circuit may be designed to allow the qualification inputs to each be individually maskable so that they do not have an effect on the global qualification output signal. The benefit of local masking at the combining circuit inputs is to allow masking of input signals that are not otherwise controllable at their destination points. For example, in FIG. 2, it may be desired to qualify only on the EQO 76 and EQO 78 inputs and not on inputs from the I/O control bus 66, thus the I/O control inputs could be masked locally at AND gate 74. To accomplish this requirement the combining circuit could contain simple masking logic associated with each input that would allow controlling each input independent from the received signal. In addition the combining circuit would need an input and output means to load the input masking control data, such as the serial test bus described in this specification.

The EQM 68 has different modes of operation or protocols allowing it to control a variety of test monitor operations. Only one of its test protocols has been described at this point, i.e., the ability to start and stop a test monitor operation in response to an internal or external signal input. Other EQM 68 operations and protocols may likewise be used. These operations and protocols are described in detail in the following U.S. Patent applications:

| Docket No. | Filing/Issue Date | Serial/Patent No. |
| --- | --- | --- |
| TI-14025 | 04/07/92 | 5,103,450 |
| TI-13800 | 03/19/91 | 5,001,713 |
| TI-14124 | 05/28/92 | 07/892,392 |
| TI-15423 | 08/06/90 | 07/563,579 |
| TI-15433 | 10/08/93 | 5,353,308 |

Figure 3:
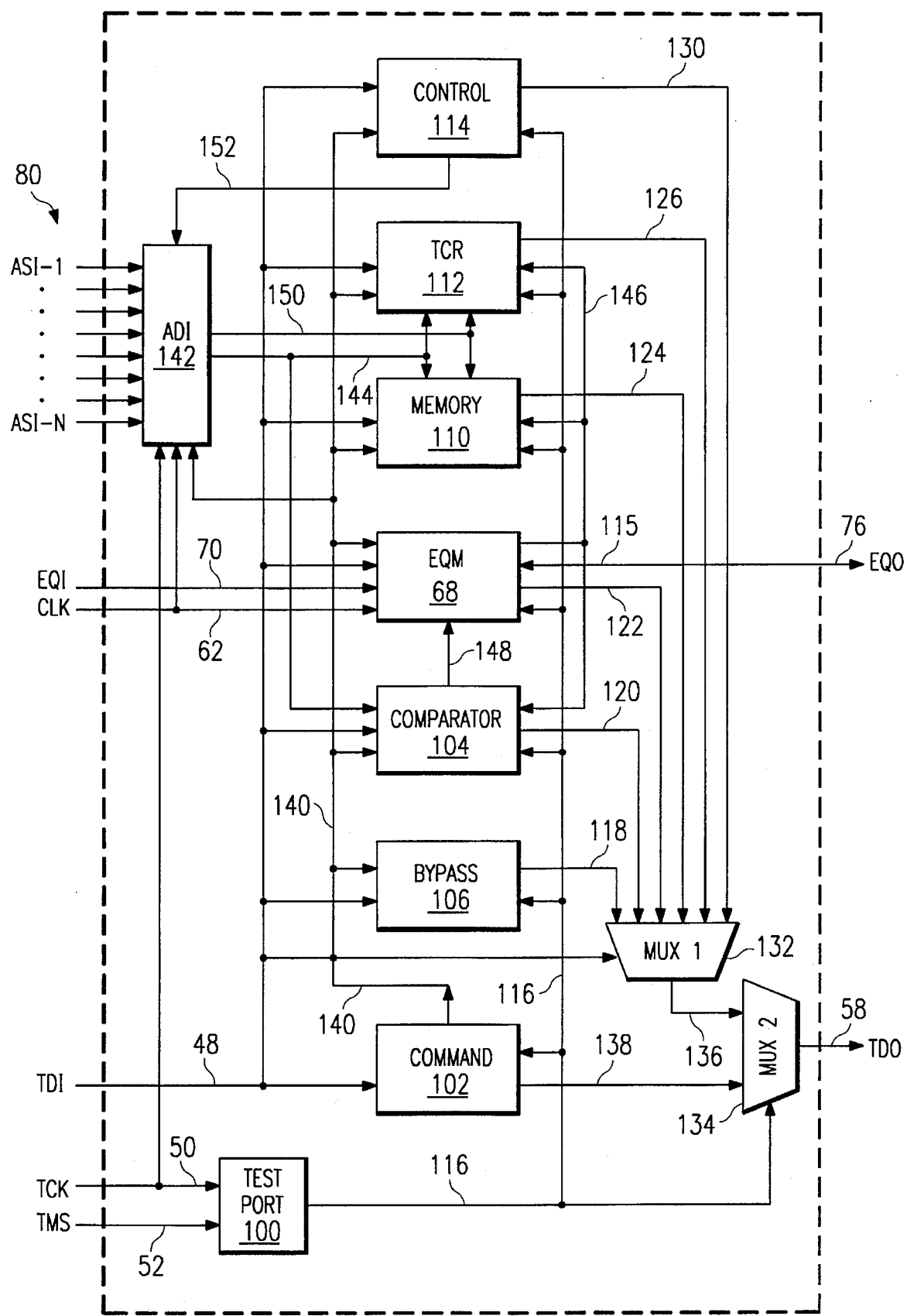
FIG. 3 illustrates the architecture of the preferred embodiment of the analog signal monitoring of the present invention.

FIG. 3 shows the architecture of ASM, such as ASM-1 40 of FIG. 2. The architecture is consistent with the generalized architecture of the Institute of Electrical and Electronics Engineers (IEEE) Standard 1149.1 (IEEE 1149.1) scan architecture for integrated circuits to the extent that it has a four-wire test bus input (TCK 50, TMS 52, TDI 48 and TDO 58) and parallel access to multiple internal scan paths (114, 112, 110, 68, 104, 106, 102). When control is input to test port 100 via TMS 52 and TCK 50 input pins, serial data is shifted from TDI input 48 through either command register 102 or one of the selectable data registers 104, 106, 68, 110, 112, or 114 to TDO output 58.

Test port 100 is an IEEE 1149.1 scan interface circuit that responds to the external test mode select (TMS) 52 or test clock (TCK) 50 input signals to shift data through either command register 102 or one of the selectable data registers 104, 106, 68, 110, 112, or 114 from TDI input 48 to TDO output 58. During scan access, test port 100 outputs control on bus 116 to cause a selected scan path to parallel load with data then shift data from TDI input 48 to TDO output 58. After completing the data shift operation through the selected scan path, test port 100 outputs control on bus 116 to cause the data that has been shifted into the selected scan path to be parallel output from scan path.

Command register 102 is a shift register defined in the IEEE 1149.1 standard that is used to store serial instructions. When selected, command register 102 receives control from test port 100 via bus 116 to shift data from TDI input 48 to TDO output 58. The instruction shifted into command register 102 is used to select one of the data registers serial outputs 118, 120, 122, 124, 126, or 130 to be connected to TDO output 58 via multiplexers 1 132 and multiplexer 2 134. Multiplexer 1 132 provides single input 136 to multiplexer 2 134. Multiplexer 2 134 provides TDO output 58 from either signal 138 from command register 102, or signal 136 from MUX 1 132. When selected, a data register scan path receives control from test port 100 to shift data from TDI 48 to TDO 58. In addition to selecting a data register for scan access, an instruction can be loaded to cause the ASM circuit to operate a test monitor operation.

Bypass register 106 is a single-bit shift register defined in the IEEE 1149.1 standard. When selected via command bus 140 and control bus 116, bypass register 106 couples TDI input 48 up to TDO input 58 through a single shift register stage. The purpose of bypass register 106 is to provide an abbreviated scan path through ASM circuit 40.

Comparator 104 is a circuit used to compare digitized analog values output from the analog-to-digital interface (ADI) 142 against expected data values. Comparator 104 contains memory for storing expected data and mask data values used in comparison operations. Comparator 104 receives input from ADI 142 on bus 144, command bus 140, EQM control bus 146 serial input 48 from TDI and the test port control bus 116. The comparator outputs a compared term (CTERM) 148 to EQM 68 and serial data 120 to TDO output 58.

The EQM 68 is a proprietary Texas Instruments circuit that controls the operation of test cell register (TCR) 112, memory buffer 110, and comparator circuit 104 during analog test monitor operations. The EQM 68 receives input from the external EQI input signal 70, and external clock signal 62, a compare term (CTERM) signal output 148 from comparator 104, command bus 140 serial input from TDI and test port control bus 116. The EQM 68 outputs test control signals to TCR 112, memory buffer 110, and comparator 104 via bus 146, status and compare signals on the external EQO output signal 76, and the serial data 122 to TDO output 58. A detailed description of EQM 68, which is hereby expressly incorporated in by reference, is given an U.S. Pat. No. 5,103,450 (TI-14025) and U.S. Pat. No. 5,001,713 (TI-13800) as stated above in connection with the description of FIG. 2.

The RAM memory 110 is used to store digitized analog data during test monitor operations. Memory buffer 110 receives input from ADI 142 from buses 144 and 150, command bus 140, EQM control bus 146, serial TDI input 48, and test port control bus 116. The memory buffer 110 outputs serial data 124 to TDO output 58.

Control register 114 is a scan path used to store control bits for ADI 142. Control register 114 receives input from command bus 140, serial input from TDI 48, and from test port control bus 116. The control register outputs control 152 to ADI 142 and serial data 130 to the TDO output 58.

ADI 142 is a circuit used to receive external analog signal inputs 80, convert them into a digital representation and output the digital representation to memory 110, TCR 112, and comparator 104 via buses 144 and 150. The ADI 142 receives external analog inputs 80, control input from command register 102 on bus 140, control input from control register 114 on bus 152, CLK input 62, and TCK input 50.

Multiplexer 1 132 is shown to select one of the serial data outputs 118, 120, 122, 124, 126, 130 from data registers 106, 104, 68, 110, 112 or 114, respectively, to be input to multiplexer 2 134, via signal 136. Multiplexer 1 132 has six serial data inputs as described above, and a selection control input from command bus 140. Multiplexer 2 134 is used to couple the serial data output 138 from command register 102 or output 136 multiplexer 1 132 to the external TDO output 58. Multiplexer 2 134 has one output, the TDO output signal 58. Multiplexer 2 134 has two serial data inputs, input 136 from multiplexer 1 132 and input 138 from the command register 102, and a selection control input from command bus 140.

The ASM circuit 40 TDI input 48 and TDO output 58 pins are arranged to allow a leading device's TDO output to drive the ASM circuit 40 TDI input 48 and a following device's TDI input to be driven by the ASM's TDO output 58. The TCK 50 and TMS 52 input signals are connected in parallel to multiple ASMs or other devices compatible with the IEEE 1149.1 standard test bus interface. FIG. 2 shows an example of this interconnect scheme between two ASMs 40 and 42.

The analog signal inputs (ASI-1 through ASI-n) 80 of ASM 40 in FIG. 3 are connected to analog signals 28 that are to be monitored (see FIG. 2). The ASI signals 80 are input to the ADI 142 where they are converted into a digital representation that can be stored into RAM memory buffer 110 and/or compressed into a signature using the TCR 112. ADI 142 allows measurement and storage of the analog voltage present at a single ASI signal input 80 or the voltage difference between two ASI signal inputs 80.

The ASM circuit 40 CLK input 62 is driven by a system clock source that is synchronous to the operation of the analog circuit and signals being monitored. The CLK signal 62 is input to the EQM 68 and ADI 142 logic blocks. During on-line analog monitoring, EQM 68 will operate synchronous with the CLK 62 input to issue control to TCR 112 and/or memory buffer 110 to store the digitized analog data output from ADI 142.

The ASM circuit 40 EQI input 70 and EQO output 76 pins are coupled to an external combining circuit such as the AND gate 74 of FIG. 2. The external combining circuit allows multiple ASMs and/or other devices that include the event qualification architecture to operate together to qualify and on line test operation.

Analog-to-Digital Interface.

Figure 4:
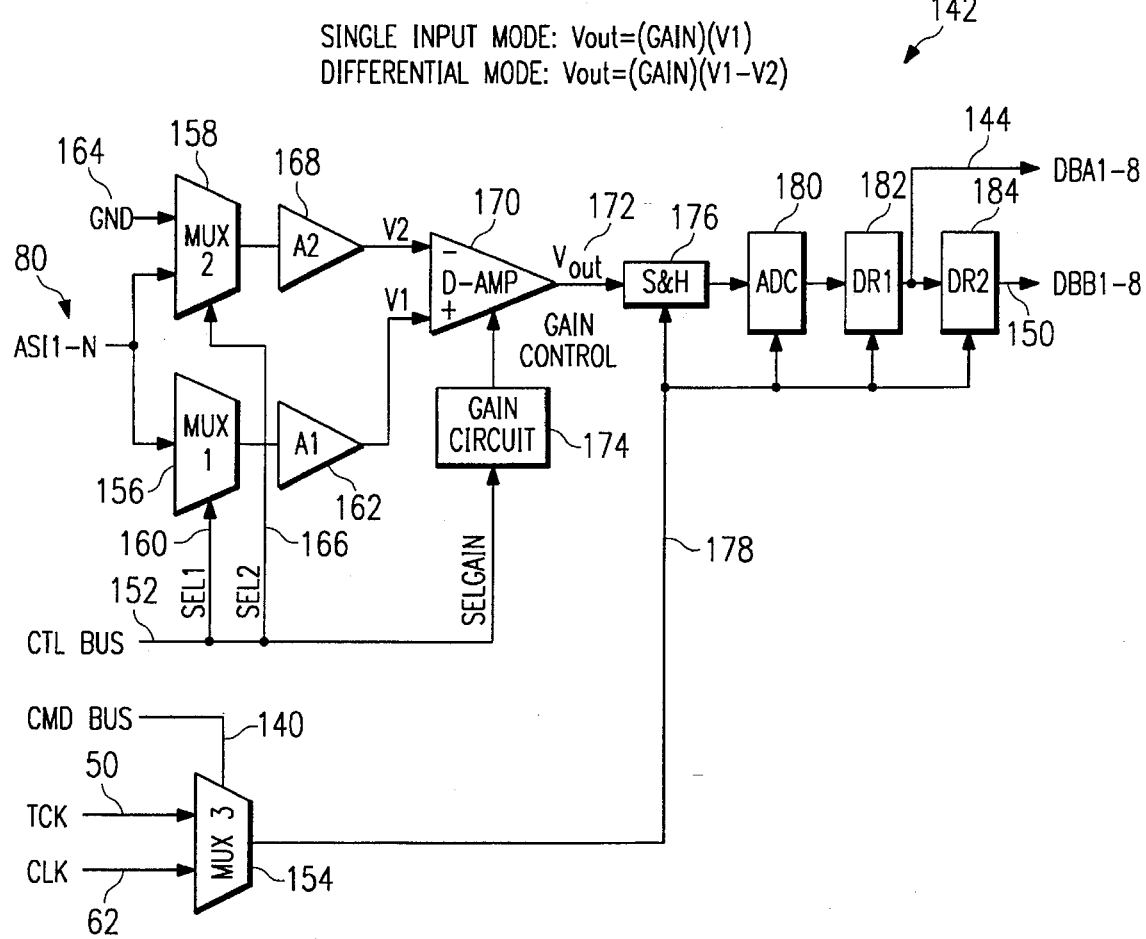
FIG. 4 illustrates a preferred embodiment of the analog-to-digital interface circuit portion of the preferred embodiment of the present invention.

The ADI 142 which FIG. 4 shows converts external analog input signals (ASI-1 through ASI-n) 80 into an equivalent digital representation so that the digitized analog signal value can be stored into the memory 110 and/or TCR 112 in response to control signals from either test port 100 via bus 116 or EQM 68 via bus 146.

Referring to FIG. 4, multiplexer 3 154 couples test clock inputs TCK 50 and CLK 62 to the circuit inside ADI 142. When the test is controlled from test port 100, multiplexer 3 154 receives control from command register 102 via bus 140 to allow the test clock (TCK) 50 to drive the ADI 142 circuits. When the test is controlled from EQM 68, multiplexer 3 154 is controlled to allow the system clock (CLK) 62 to drive the ADI 142 circuits.

Each of the analog multiplexers 156 and 158 permit selecting one of the analog signals (ASI-1 through ASI-n) 80 to be input to ADI 142. Multiplexer 1 156 receives the external analog signals 80 and select control input 160 from control register 114 via bus 152. Multiplexer 1 156 outputs the selected analog signal into a unity gain (1:1) amplifier A1 162. Multiplexer 2 158 receives the external analog inputs 80, a ground reference voltage (0 volts) 164, and selection control input 166 on bus 152. Multiplexer 158 outputs the selected analog signal into a unity gain amplifier A2 168.

The A1 amplifier 162 and A2 amplifier 168 provide a high impedance input to the selected analog signal to minimize the signal loading. The voltage output from A1 (V1) and A2 (V2) is equal to the voltage input, i.e., the amplifiers have a gain of 1. The V1 and V2 outputs of A1 and A2 are input to a differential amplifier (D-AMP) 170.

The D-AMP 170 measures the voltage difference between two analog input signals or the voltage on a single analog signal, and provides a programmable gain capability. The ability to adjust the D-AMP 170 gain, via the programmable gain input, improves the accuracy of very low-level analog voltage measurements. The D-AMP 170 receives V1 and V2 analog signals from amplifier A1 162 and A2 168 gain control from gain circuit 174. The D-AMP and outputs a signal indicating the voltage difference between the two on the $V_{out}$ output 172. The GAIN circuit 174 receives gain setting input from control register 114 via bus 152 and outputs gain control to D-AMP 170 that adjusts the gain of D-AMP output $V_{out}$ 172.

The ability to measure the voltage difference between two analog signals is important in many analog test scenarios. One test scenario for the difference measurement is the ability to measure the voltage drop across a resistor from the resistors' input current node to its output current node. By knowing the voltage drop and the resistance value, the current through the resistor can be derived. An equation representing the output of the D-AMP 170 during difference measurements is $$V_{out}=(V1-V2)\times(GAIN). \quad (1)$$

For example, if V1 is 5 volts and V2 is 2.5 volts and the gain is set for an amplification of 2, the $V_{out}$ signal is equal to;

$$V_{out}=(5-2.5)\times(2)=5 \text{ volts}. \quad (2)$$

The ability to measure the voltage on a single analog signal is also important in many analog test scenarios. One test scenario for a single analog signal measurement is the ability to measure the output voltage of a voltage power supply with reference to the electrical ground (GND) 164. By selecting the GND (0 volt) input 164 to Multiplexer 2 158 to be input to the D-AMP 170 at V2, equation (1) changes to allow $V_{out}$ 172 to be equal to only the V1 input times the GAIN setting, i.e., $$V_{out}=(V1)\times(GAIN). \quad (3)$$

For example, if V1 is 2.5 volts and the gain is set for an amplification of 3, $$V_{out}=(2.5)\times(3)=7.5 \text{ volts}. \quad (4)$$

The sample and hold (S&H) circuit 176 samples and holds the analog signal output $V_{out}$, 172 from the D-AMP 170. S&H circuit 176 receives the output signal $V_{out}$, from D-AMP 170 and a clock input 178 from the clock multiplexer 3 154. S&H circuit 176 outputs a sampled voltage level to the analog-to-digital converter (ADC) 180. S&H circuit 176 acts as a capacitor that can instantaneously store the voltage level being input from the D-AMP 170 in response to clock input 178. The voltage level stored and output from the S&H circuit 176 remains constant until the next clock input 178.

The ADC circuit 180 converts the analog signal input from S&H circuit 176 into a digital representation. ADC circuit 180 receives the analog signal output from S&H circuit 176 and a clock input 178 from Multiplexer 3 154. In response to clock input 178, ADC circuit 180 translates the analog signal input from S&H circuit 176 into an equivalent digital value and outputs the digital value to a first digital register (DR1) 182. This analog-to-digital translation process repeats in response to subsequent clock inputs 178.

The DR1 182 provides a storage means for the digitized analog data output from ADC 180. DR1 182 receives the digital output from ADC 180 and a clock input 178 from Multiplexer 3 154. DR1 182 stores data in response to clock input 178. DR1 182 outputs stored data to a second data register (DR2) 184, memory 110, TCR 112, and comparator 104 via data bus A (DBA1-8) 144. DR2 184 provides a storage means for the data output from DR1 182. DR2 184 receives the digital output from DR1 182 and a clock input from Multiplexer 3 154. DR2 184 stores data in response to clock input 178. The DR2 184 outputs stored data to memory 110 and TCR 112 via data bus B (DSS1-8) 150.

During test operations controlled by test port 100, DR1 182 stores the digital output from ADC 180 for one test port clock (TCK) 50 cycle to allow time for TCR 112 and memory 110 to store the data. Test port 100 receives external control input on TCK 50 and TMS 52 pins to cause TCR 112 and memory 110 to store the data output from DR1 182. EQM 68 and comparator 104 are not required for test operations controlled by external control input via test port 100.

During test operations controlled by EQM 68, DR1 182 is used to store the digital output from ADC 180 for one system clock (CLK) 62 cycle to allow time for comparator 104 to match the digital value output from DR1 182 on bus DBA1-8 144 against a stored expected value in comparator 104. If the data from DR1 182 matches with the expected data, the comparator 104 outputs a signal to EQM 68 via the CTERM signal 148 (See FIG. 3). On the next CLK input 62, the match data from DR1 182 is transferred into DR2 184, and EQM 68 responds to the CTERM match signal input 148 and outputs control to TCR 112 and memory 110. On the next CLK input 62, TCR 112 and memory 110 store the "match" data output from DR2 184.

Thus, the purpose of DR2 184 is to store (or "pipeline") the data that matched for one clock cycle after the match to allow the data to be stored in TCR 112 or memory 110. Without DR2 184, the match data would be lost and TCR 180 and memory 110 would start storing the data after the match data. Depending on the type of test being performed, EQM 68 may output control to continue storing, on subsequent CLK inputs 62, the data followed by the "match" data or stop storing data after the "match" data is stored.

Operation of the Analog-to-Digital (ADI) Circuit

When ADI circuit 142 translates an analog signal input 80 into a binary bit representation, each bit position that is set to a logic high logic level is assigned a numerical weight. The most significant binary bit position has the largest numerical weight which is equal to ½ of the maximum voltage input. The least significant bit position has the smallest numerical weight which is equal to $½^n$ of the maximum voltage input, where "n" equals the number of binary bits. Binary bit positions between the most and least significant bit positions are numerically weighted according to their bit position, the more significant the bit position the higher the numerical weight given.

Bit Position v. Weight, Listing For 8-Bit Binary Position $$\text{MSB} \quad \text{Bit } 8 = W_8 = 1/2^1 = 1/2 \tag{5}$$

$$\text{Bit } 7 = W_7 = 1/2^2 = 1/4$$

$$\text{Bit } 6 = W_6 = 1/2^3 = 1/8$$

$$\text{Bit } 5 = W_5 = 2/2^4 = 1/16$$

$$\text{Bit } 4 = W_4 = 2/2^5 = 1/32$$

$$\text{Bit } 3 = W_3 = 1/2^6 = 1/64$$

$$\text{Bit } 2 = W_2 = 1/2^7 = 1/128$$

$$\text{LSB} \quad \text{Bit } 1 = W_1 = 1/2^8 = 1/256$$

For example, bits 1 through 8 are shown below along with their numerical weighing $W_1, W_2, \ldots W_8$. Bit 8 is the most significant and carries the most weight (½), and Bit 1 is the least significant and carries the least weight (1/256). The following equation states that the sum of the weights (1–j) of the binary bit positions (W) that are set to a logic high level ($C_i$) is multiplied by the maximum voltage ($V_{mx}$) to determine the magnitude of the digitized analog voltage input signal:

Digitized Analog Voltage = (6)

$$V_{mx} \sum_{i=1}^{j} C_i W_i = V_{mx}[C_1 W_1 + C_2 W_2 + \ldots + C_8 W_8]$$

It is important to note that the bit position's weight ($W_i$) is summed only if the bit ($C_i$) is set to a high logic level.

The following eight bit binary patterns represent corresponding analog voltage levels between 0 volts (minimum) and 10 volts (maximum) as determined by the bit position weights that are set to high logic levels. The weight given to a particular bit position (Wi) in the binary patterns below is obtained from the bit position vs weight listing above.

```
MSB         LSB
B B B B B B B B
8 7 6 5 4 3 2 1
0 0 0 0 0 0 0 0 = [0] × 10 Volts = 0 Volts
0 0 0 0 0 0 0 1 = [W1] × 10 Volts = 0.039 Volts
0 0 0 0 0 0 1 0 = [W2] × 10 Volts = 0.078 Volts
0 0 0 0 0 1 0 0 = [W3] × 10 Volts = 0.156 Volts
0 0 0 0 1 0 0 0 = [W4] × 10 Volts = 0.312 Volts
0 0 0 1 0 0 0 0 = [W5] × 10 Volts = 0.625 Volts
0 0 1 0 0 0 0 0 = [W6] × 10 Volts = 1.25 Volts
0 1 0 0 0 0 0 0 = [W7] × 10 Volts = 2.5 Volts
1 0 0 0 0 0 0 0 = [W8] × 10 Volts = 5.0 Volts
1 0 0 0 0 0 0 1 = [W1 + W8] × 10 Volts = 5.039 Volts
1 0 0 0 0 0 1 1 = [W2 + W8] × 10 Volts = 5.078 Volts
1 0 0 0 0 0 1 1 = [W1 + W2 + W8] × 10 Volts = 5.117 Volts
. . . . . . . .
. . . . . . . .
1 1 1 1 1 1 1 1 = [W1 + W2 + ... + W8] × 10 Volts = 10 Volts
```

In the above example of a binary-weighted digital pattern, the resolution of the analog measurement is determined by the weight of the least significant bit. The weight of the least significant bit, in turn, is determined by the width of the binary bit pattern. For the 8-bit pattern shown above, the resolution is determined by the weight given to bit position 1, which is $W_1$ above, or 1/256. For a 7-bit pattern, the resolution is the weight given to bit position 2, which is $W_2$ above, or 1/128. For a 6-bit pattern, the resolution is the weight given to bit position 3, $W_3$ above, or 1/64.

Memory Buffer

Figure 5:
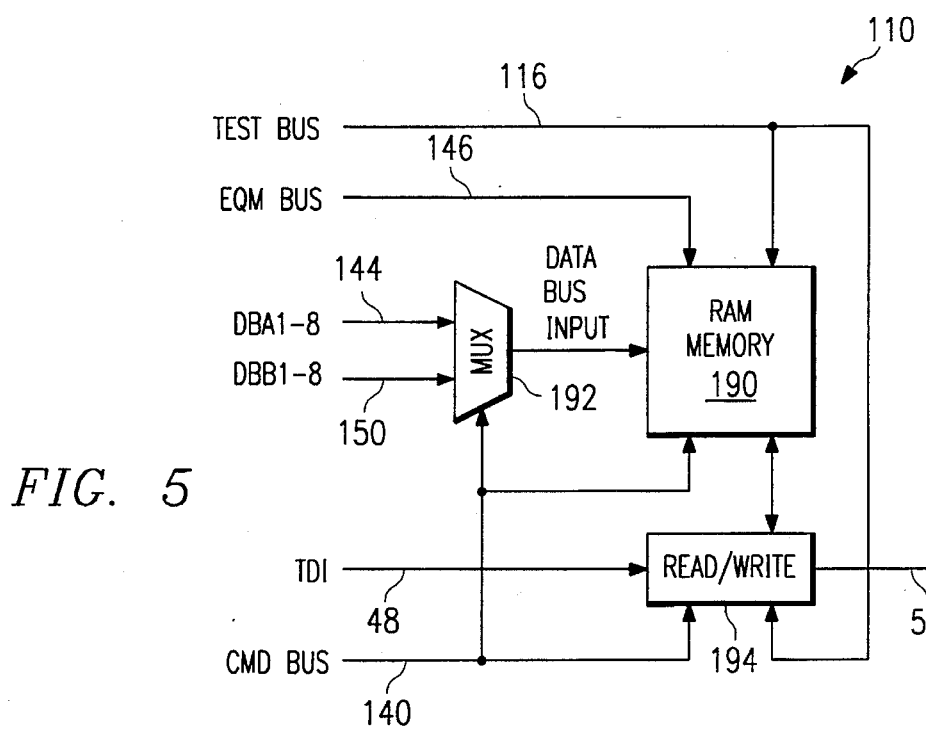
FIG. 5 illustrates a preferred embodiment of the memory circuit portion of the preferred embodiment of the present invention.

FIG. 5 shows memory circuit 110, which is used to store the digitized analog data output from ADI 142 on buses DBA1-8 144 and DBB1-8 150. Memory circuit 110 consists of read/write memory 190, data bus multiplexer 192, and scan path 194.

RAM memory 190 stores the digitized analog inputs from ADI 142. Memory 190 receives parallel data input from data bus multiplexer 192, control input from command register 102 via bus 140, control input from EQM 68 via bus 146, control input from test port 100 via bus 116, and parallel data input from scan path 194. Memory 190 outputs parallel data to the scan path 194.

Data bus multiplexer 192 provides selection of the data bus input to the memory 190. The data bus multiplexer 192 receives the DBA1-8 data bus input 144 and DBB1-8 data bus input 150 from ADI 142, and control input from command register 102 via bus 140. The data bus multiplexer 192 outputs parallel data to memory 190.

Scan path 194 allows serial reading and writing of parallel data to and from memory 190 via test port 100. Scan path 194 receives serial input from TDI input pin 48, parallel input from memory 190, and control input from test port 100 via bus 116. Scan path 194 outputs serial data to TDO output pin 58 and parallel data to memory 190.

When test port 100 controls the test monitoring operation, data bus multiplexer 192 receives control from command register 102 via bus 140 to select DBA1-8 144 to be input and stored in memory 190. The data is stored into memory 190 when the memory 190 receives control input from test port 100 control bus 116.

When the test is controlled from EQM 68, the data bus multiplexer receives control from the command register via bus 140 to select DBB1-8 150 to be input and stored in the memory 190. The data is stored into memory 190 when the memory 190 receives control input from the EQM control bus 146.

After a test monitoring operation, the contents of memory 190 may be read out of ASM 40 by the scan path 194. During scan out operations, scan path 194 and memory 190 receive control from test port 100 to allow the memory 190 to parallel load data into the scan path 194 to be shifted out for inspection.

Test Cell Register.

Figure 6:
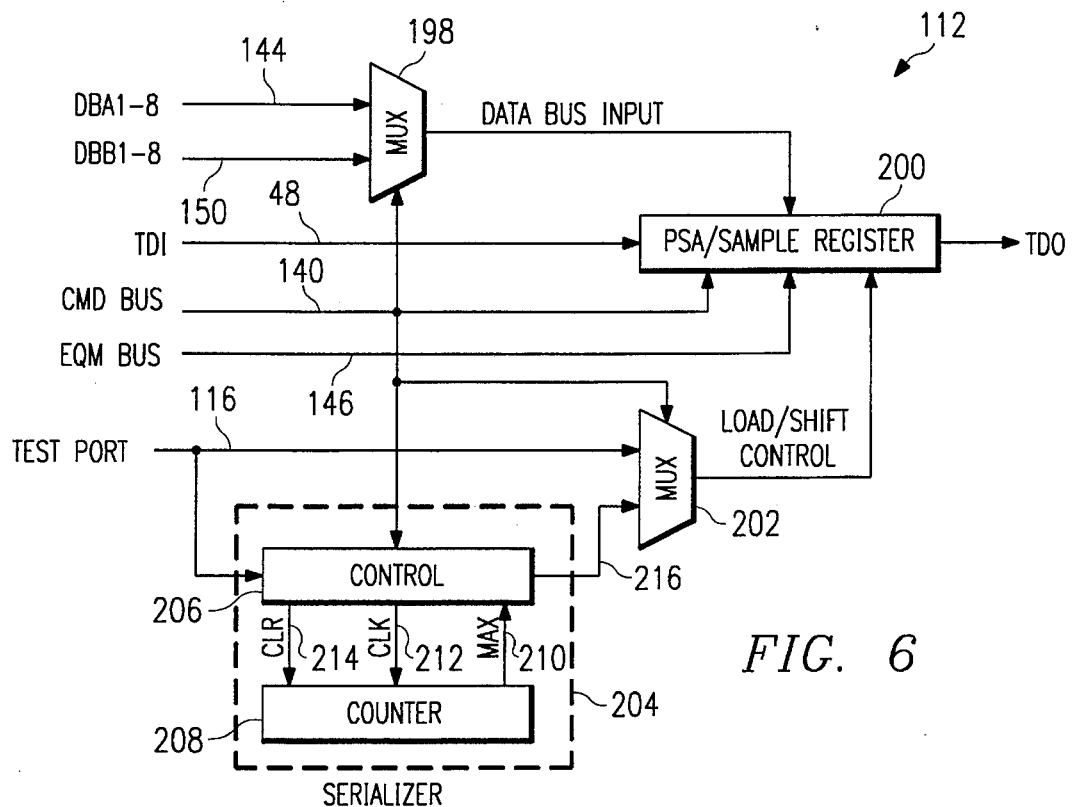
FIG. 6 shows the preferred embodiment of the test cell register portion of the preferred embodiment of the present invention.

FIG. 6 shows TCR circuit 112 which is used to capture and compress digitized analog data output from ADI 142 on buses DBA1-8 144 or DBB1-8 150. The TCR circuit 112 consists of data bus multiplexer 198, a scanable parallel signature analysis (hereinafter "PSA") PSA/sample register 200, load/shift control multiplexer 202, and serializer 204 which comprises control circuit 206 and counter 208.

Data bus multiplexer 198 allows selecting which parallel data bus output 144 or 150 from the ADI 142 is input to PSA/sample register 200. Data bus multiplexer 198 receives DBA1-8 data bus input 144 and DBB1-8 data bus input 150 from ADI 142, and control input from command register 102 via bus 140. Data bus multiplexer 198 outputs parallel data to PSA/sample register 200.

PSA/sample register 200 allows sampling a single parallel data input or compressing multiple parallel data inputs into a signature using a parallel signature analysis technique. PSA/sample register 200 receives serial data input from the ASM TDI pin 48, parallel data input from data bus multiplexer 198, control input from command register 102 via bus 140, control input from load/shift control multiplexer 202, and control input from EQM 68 via bus 146. PSA/sample register 200 outputs serial data to the ASM TDO pin 58.

The load/shift control multiplexer 202 allows either the load/shift control output from test port 100 or the load/shift control output from the serializer 204 to be input to PSA/sample register 200. The load/shift control multiplexer 202 receives selection control input from command register 102 via bus 140, load/shift control input from test port 100 via bus 116, and load/shift control input from serializer 204. The load/shift multiplexer 202 outputs load/shift control to PSA/sample register 200.

Serializer 204 permits repeating the steps of: (1) parallel loading data from data bus multiplexer 198 into PSA/sample register 200, (2) shifting out the data loaded in PSA/sample register 200 for a predetermined number of bit-shift operations, and (3) repeating steps (1) and (2) while test port 100 outputs control to shift data out of ASM 40. The loading process occurs in such a way as not to inhibit the shifting process. Serializer 202 consists of control circuit 206 for loading data into and shifting data out of PSA/sample register 200 and counter circuit 208 for counting the number of bit-shift operations performed in PSA/sample register 200.

Serializer control circuit 206 receives control input from command register 102 via bus 140, control input from test port 100 via bus 116, and a maximum count (MAX) signal 210 from counter 208. Control circuit 206 outputs clock (CLK) 212 and clear (CLR) 214 signals to counter 208 and load/shift control 216 to load/shift control multiplexer 202. Counter circuit 208 outputs a maximum count (MAX) 210 signal to control circuit 206 and receives CLK 212 and CLR 214 signals from control circuit 206.

When test port 100 controls the PSA, sample, or serialize test, data bus multiplexer 198 receives control from command register 102 via bus 140 to select DBA1-8 144 to be input to the PSA/sample register 200. The data is sampled or compressed into a signature by PSA/sample register 200 when it receives control input from test port control bus 116.

When EQM 68 controls the PSA or sample test, data bus multiplexer 198 receives control from command register 102 via bus 140 to select DBB1-8 150 to be input to PSA/sample register 200. PSA/sample register 200 samples or compresses the data when it receives control input from EQM 68 via control bus 146.

During PSA operations, a predetermined number of parallel data inputs from the data bus multiplexer 198 are clocked into PSA/sample register 200. Each parallel data input clocked into PSA/sample register 200 combines with the pre-existing contents of PSA/sample register 200. PSA/sample register 200 also stores the result of this combining operation. At the end of the PSA operation, the data pattern stored in PSA/sample register 200 is known as the "signature" of all the parallel data inputs clocked into PSA/sample register 200. The signature value will always be the same if the PSA/sample register 200 is initially set to a predetermined first data value, referred to as the "seed value", and the same known sequence of parallel data inputs are clocked into PSA/sample register 200.

After a PSA or sample test operation, PSA/sample register 200 can receive control from command register 102 and test port 100 to shift the data sampled or the signature compressed out of ASM 40 for inspection. If the inspection finds that the sampled data or the signature matches an expected value the test passed, otherwise it fails.

Advantages of the Serializer

Figure 9:
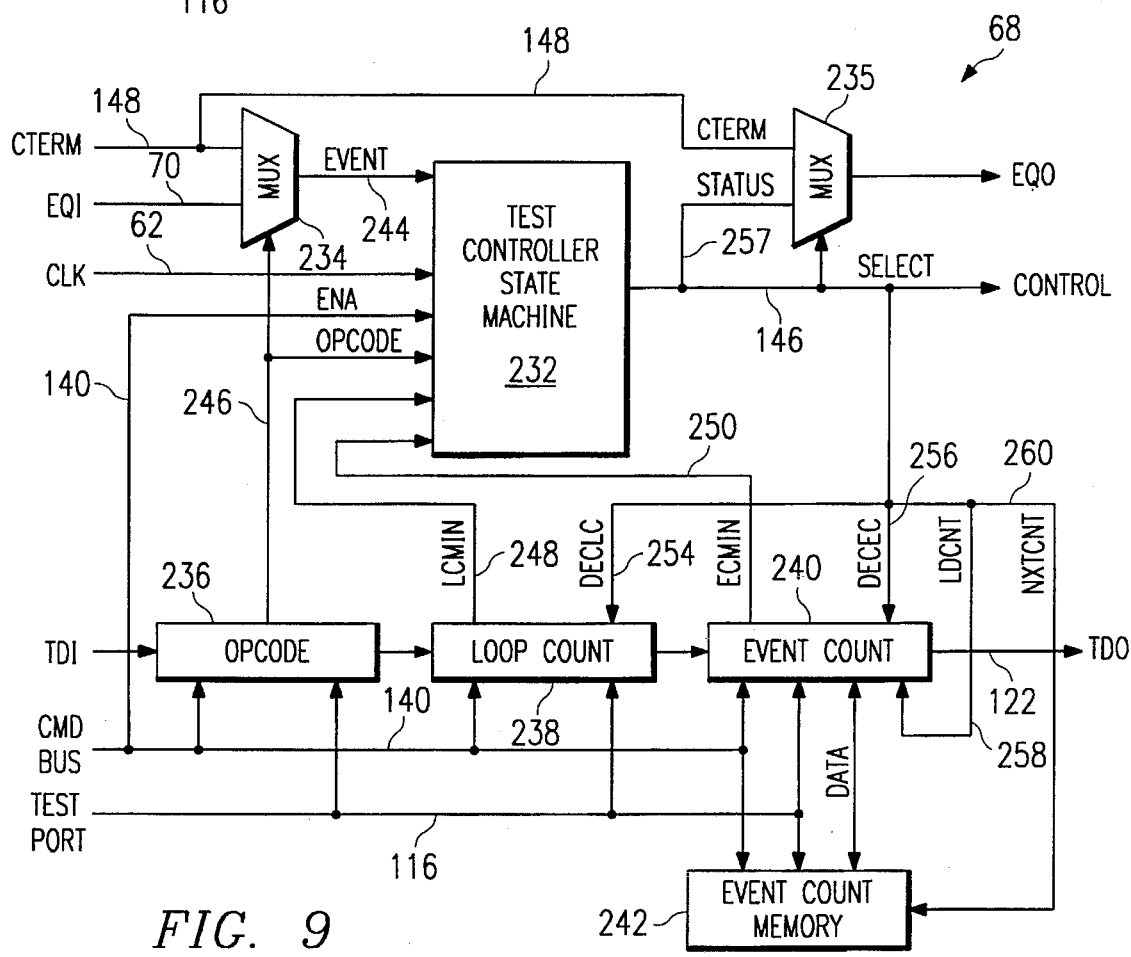
FIG. 9 shows the event qualification module of the preferred embodiment of the present invention.

The advantage of serializer 204 include its ability to repetitively load and shift out multiple digitized analog input signals during one IEEE 1149.1 data scan shift cycle. This increases the output rate of the digitized analog data. FIG. 9 illustrates the IEEE 1149.1 test port state diagram. The state diagram defines the scan cycle for accessing a device's instruction or data register. The following description illustrates the speed advantage gained by using serializer 204 to output multiple digitized analog data packets during one IEEE 1149.1 scan cycle, instead of outputting the data packets one at a time using multiple IEEE 1149.1 scan cycles. U.S. patent application Ser. No. 07/502,470 (TI-14996) now abandoned provides a detailed description of this technique, as it applies to reading and writing digital memory elements. The details of that U.S. Patent Application are herein incorporated by reference.

Figure 7:
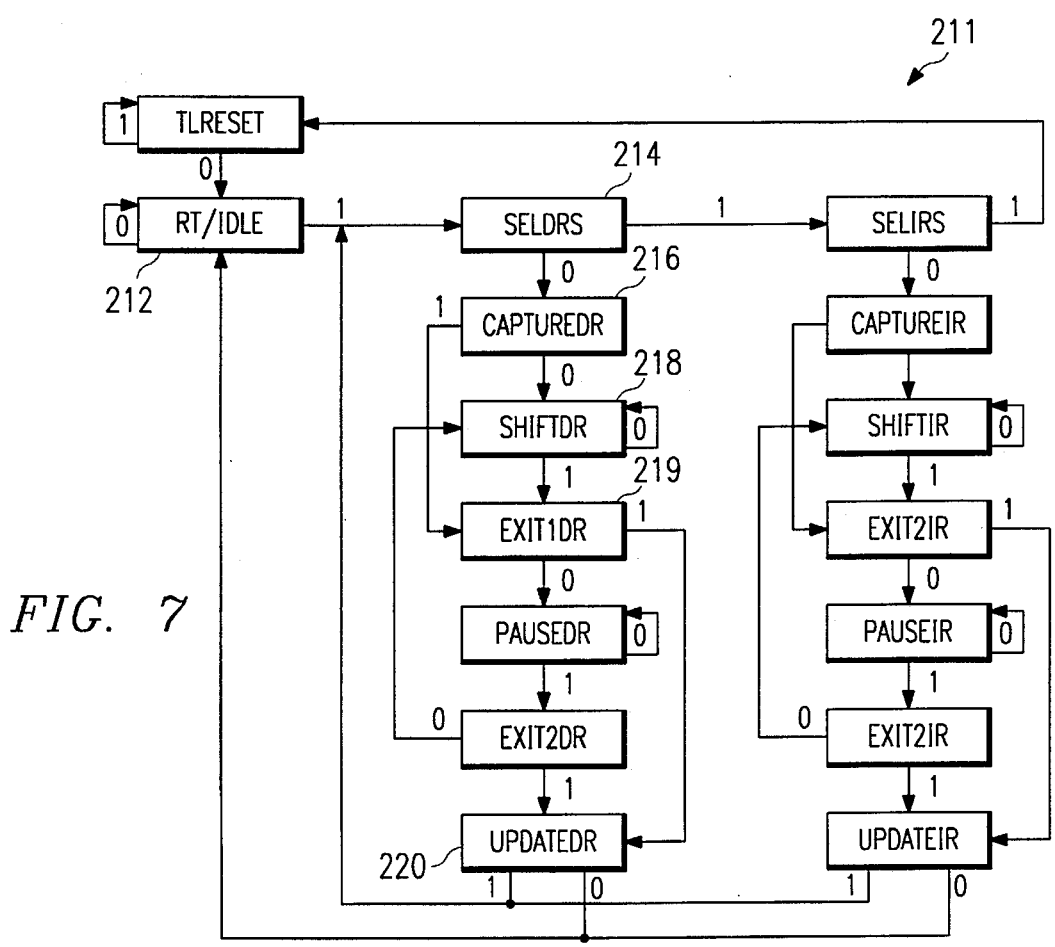
FIG. 7 provides an illustrative state diagram of the test port according to IEEE 1149.1 specification used in the preferred embodiment of the present invention.

Referring to FIG. 7, an IEEE 1149.1 data scan cycle 211 is initiated by moving from the run test/idle (RT/IDLE) state 212, through the select data register scan (SELDRS) 214 and capture data register (CAPTUREDR) 216 states, and into shift data register (SHIFTDR) state 218. When moving from the CAPTUREDR state 216 into the SHIFTDR state 218, data is parallel loaded into the selected data register. While in the SHIFTDR state 218, data loaded into the data register is shifted out of the device via the TDO output 58 and into the test bus controller 44 (See FIG. 2). Data scan cycle 211 is terminated after the data has been shifted out by moving from the SHIFTDR state 218, through the EXIT 1 data register state (EXIT1DR) 219 and data register update state (UPDATEDR) 220 and into either the RT/IDLE 212 or SELDRS 214 states.

If multiple devices lie between the device loading and shifting out data and the test bus controller, the data must serially pass through all the devices between the sending device and test bus controller 44. Therefore, the SHIFTDR state 218 must be maintained for the length of time (or for the number of scan clock cycles) it takes for the data to be shifted out of the sending device, shifted through all intermediate devices, and finally shifted into the receiving device (test bus controller 44). Assuming that 8-bits are shifted out of the sending device, 100 scan bits exist between the sending and receiving device, and 8-bits are shifted into the receiving device, the number of clocks required to shift out one thousand 8-bit data packets using one thousand IEEE 1149.1 data scan cycles 211, (ignoring the clocks required to move between states) is given by the following formula:

$$\begin{aligned} \text{Clocks} &= [8 \text{ bits (sender)} + 100 \text{ bits (scan path)} + 8 \text{ bits} \\ &\quad (\text{Receiver})] \times 1000 \text{ cycles} \\ &= 116{,}000 \text{ clocks} \end{aligned} \quad (7)$$

Since the serializer 204 can autonomously parallel load and serially shift out multiple data packets while the IEEE 1149.1 test bus is in the SHIFTDR state 218, all data from a sending device can be serially output, passed through all intermediate device scan paths, and input into the receiving device during a single data scan cycle. Using serializer 204 and the same assumptions stated above, the number of clocks required to shift one thousand 9-bit data packets during one IEEE 1149.1 scan cycle 211 is given by the following formula:

$$\text{Clocks} = [8 \text{ bits (Sender)} \times 1000 \text{ (Packets)}] + 100 \text{ bits} \quad (8)$$
$$\text{(scan path)} + 8 \text{ bits (Receiver)}$$
$$= 8,100 \text{ clocks}$$

From these two examples, it is clear that serializer 204 significantly reduces the number of scan clocks required to access multiple digitized analog data packets when compared to the number of scan clocks required using multiple IEEE 1149.1 data scan cycles 211 to access the data packets. Using a 1 Megahertz scan clock (period=1 microsecond) the access time for the IEEE 1149.1 method and serializer method is given in equations (9) and (10) below:

$$\text{IEEE 1149.1 access time} = 116{,}000 \text{ clocks} \times 1 \text{ microsecond} \quad (9)$$
$$= 116 \text{ milliseconds}$$
$$\text{Serializer access time} = 8{,}108 \text{ clocks} \times 1 \text{ microsecond} \quad (10)$$
$$= 8.1 \text{ milliseconds}$$

Comparing the 8.1 millisecond access time using serializer 204 with the 116 milliseconds access time using the IEEE 1149.1 scan cycles 211 shows that serializer 204 can access an identical number of digitized analog data packets using only 7% of the time required by the IEEE 1149.1 scan cycle method.

Comparator Circuit

Figure 8:
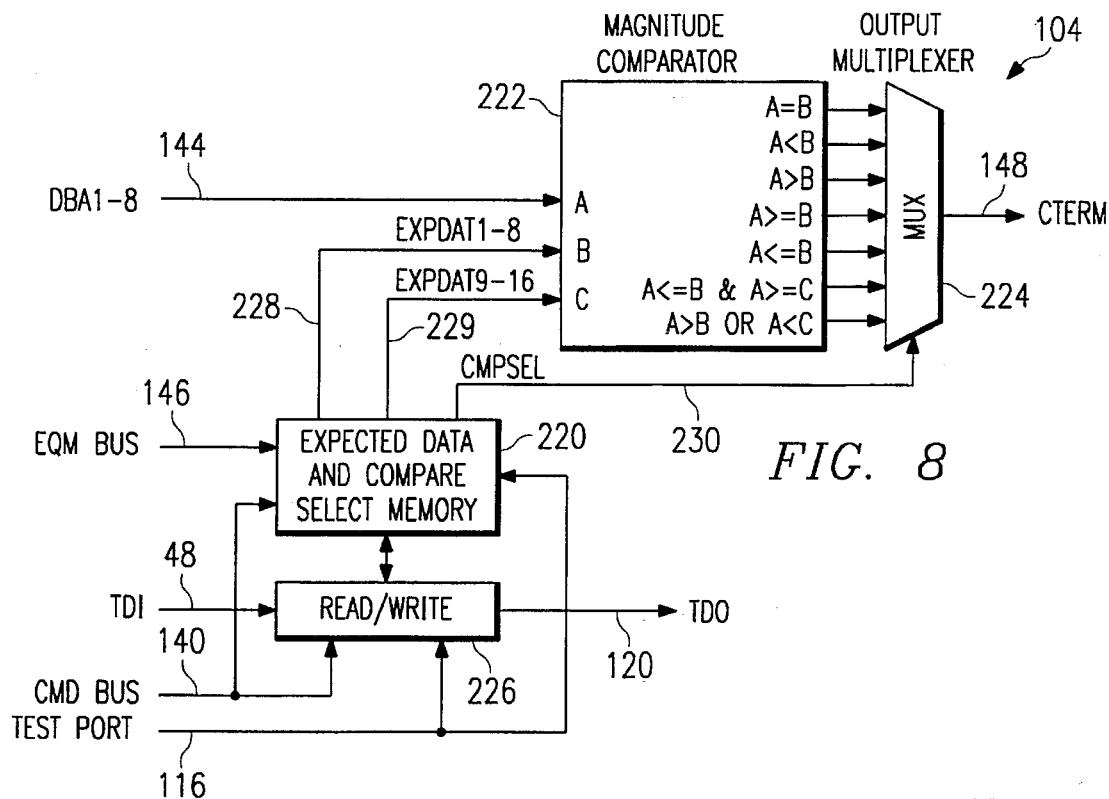
FIG. 8 illustrates the comparator circuit portion of the preferred embodiment of the present invention.

FIG. 8 shows comparator circuit 104 which compares the digitized analog data output from ADI 142 on bus DBA1-8 144 against a stored expected data value. The result of the compare is output to the EQM 68. Comparator circuit 104 consists of a read/write expected data and compare select memory 220, magnitude comparator 222, compare output multiplexer 224, and scan path 226.

Expected data and compare select memory 220 provides a means for storing expected data to compare against the digitized analog data input from ADI 142 via bus DBA1-8 144. Memory 220 also provides storage for control signals used to select which output from the magnitude comparator is input to EQM 68 via the output multiplexer 224 and CTERM signal 148. Memory 220 receives parallel data input from scan path 226, control input from test port 100 via bus 116, control input from command register 102 via command bus 140, and control input from EQM 68 via EQM bus 146. Memory 220 outputs parallel data to magnitude comparator 224 via EXPDAT1-8 bus 228 EXPDAT9-16 Bus 229, and output selection control to output multiplexer 224 via CMPSEL bus 230.

Magnitude comparator 222 compares the DBA1-8 data input 144 from ADI 142 against EXPDAT1-8 data input 228 and EXPDAT9-16 data input 229 from memory 220. Magnitude comparator 222 can indicate when the following conditions occur: DBA input 144 equals EXPDAT1-8 input 228, DBA input 144 is greater than EXPDAT1-8 input 228, DBA input 144 is less than EXPDAT1-8 input 228, DBA input 144 is equal to or greater than EXPDAT1-8 input 228, DBA input 144 is equal to or less than EXPDAT1-8 input 228, DBA input 144 is less than or equal to EXPDAT1-8 and greater 62 than or equal to EXPDAT9-16, and DBA input 144 is greater than EXPDAT1-8 or less than EXPDAT9-16. Magnitude comparator 222 receives the DBA1-8 input 144 on its A input port EXPDAT1-8 data 228 on its B input port and EXPDAT9-16 data 229 on its C input port. Magnitude comparator 224 outputs the following signals; A=B, A>B, A<B, A≧B, A≦B, A≦B and A≧C, and A>B or A<C to compare output multiplexer 224.

Compare output multiplexer 224 permits selecting one of the compare signals from the magnitude comparator 220 to be input to EQM 68. Output multiplexer 224 receives the A=B, A>B, A<B, A≧B, A≦B, A<=B and A>=C, and A>B or A<C signals from the magnitude comparator and compare select (CMPSEL) control signals 230 from memory 220. Output multiplexer 224 outputs the selected compare signal to EQN 68 via CTERM signal 148.

Scan path 226 serially reads and writes parallel data to and from expected data and compare select memory 220 via test port 100. Scan path 226 receives serial input from the TDI input pin 48, parallel input from memory 220, control input from command register 102 via bus 140 and control input from test port 100 via bus 116. Scan path 226 outputs serial data to TDO output 58 and parallel data to memory 220.

Before an EQM-controlled test monitoring operation begins, expected data and compare output selection control is loaded into memory 220 via scan path 226. During a scan input operation, scan path 226 and memory 220 receive control from test port 100 and command register 102 to allow data to be serially shifted into scan path 226 and then parallel loaded into memory 220.

During test, command register 102 inputs control into memory 220 via control bus 140 to enable memory 220 to respond to control input from EQM 68 via bus 146. In response to control input from EQM 68, the memory outputs EXPDAT1-8 228 and EXPDAT9-16 229 to magnitude comparator 222 and CMPSEL control 230 to output multiplexer 224. EXPDAT1-8 228 and EXPDAT9-16 229 are compared against the data input from ADI 142 on bus DBA 1-8 144 and the CMPSEL 230 couples the CTERM input 148 to the EQM 68 to one of the five selectable magnitude compare output signals from the magnitude comparator 222. Assuming that CTERM input 148 is coupled to the A=B output, of magnitude comparator 222, EQM 68 will receive a CTERM signal when DBA1-8 input 144 matches the current EXPDAT1-8 output 228. If CTERM 148 is coupled to the A<B output of magnitude comparator 222, EQM 68 will receive a CTERM signal when the DBA1-8 input value 144 is less than the EXPDAT1-8 input value 228. If CTERM 148 is coupled to the A>B output of magnitude comparator 222, EQM 68 will receive a CTERM signal when the DBA1-8 input value 144 is greater than the EXPDAT1-8 input value 228. If CTERM 148 is coupled to the A=<B output of magnitude comparator 222, EQM 68 will receive a CTERM signal when the DBA1-8 input value 144 is equal to or less than the EXPDAT1-8 input value 228. If CTERM 148 is coupled to the "A=<B and A>=C" output of magnitude comparator 222, EQM 68 will receive a CTERM signal when the DBA1-8 input value 144 lies within the window bounded on the upper end by EXPDAT1-8 data input 228 and on the lower end by EXPDAT9-16 data input 229. If CTERM 148 is coupled to the "A>B and A<C" output of magnitude comparator 222, EQM 68 will receive a CTERM signal when the DBA1-8 input value 144 lies outside the window bounded on the upper end by EXPDAT1-8 data input 228 and on the lower end by EXPDAT 9-16 data input 229. In response to a match input on the CTERM input 148, EQM 68 will input control to cause the memory 220 to output a next set of EXPDAT1-8 228, EXPDAT9-16 229 and CMPSEL 230 outputs after the current match input expires to provide the data and control for another magnitude compare operation against the data input on the DBA1-8 input bus.

Qualifier Module Circuit.

FIG. 9 shows EQM circuit 68 which controls ASM circuit 40 operations that are qualified by either signal input from the internal CTERM signal 148 or from the external EQI input 70. The EQM 68 is clocked from the system clock input CLK 62 to enable the tests to operate synchronous to the system circuit being monitored. The EQM 68 consists of a test controller state machine 232, and an event multiplexer 234, EQO output multiplexer 235, a scanable operation code (OPCODE) register 236, a scanable loop counter 238, a scanable event counter 240, and a read/write event count memory 242.

Test controller 232 internally controls test circuits (TCR 112 and memory 110) inside ASM circuit 40 to compress and/or store digitized analog data input from ADI 142 in response to event inputs from either the CTERM 148 or EQI 70 signals. Test controller 232 receives an EVENT input 244 from event multiplexer 234, an external system clock input from the CLK pin 62, and enable (ENA) from command register bus 140, a test OPCODE input 246 from OPCODE register 236, a loop count minimum (LCMIN) input 248 from the scanable loop counter 238, and an event count minimum (ECMIN) input 250 from scanable event counter 240. Test controller 232 outputs control 146 to loop counter 238, event counter 240, event count memory 242, comparator 104, TCR 112, and memory 110 via control bus 146.

Event multiplexer 234 permits a selection of either internal CTERM signal 148 or external EQI signal 70 as input to test controller 232. Event multiplexer 234 receives CTERM signal 148 from comparator 104, the EQI signal from the EQI pin 70, and control input from scanable OPCODE register 236. Event multiplexer 234 outputs an event signal 244 to test controller 232.

EQO multiplexer 235 permits a selection of either the CTERM 148 or STATUS information 257 from the test controller on control bus 148 to be output from the EQM 68 and ASM 40. EQO multiplexer 235 receives the CTERM signal from comparator 104 and STATUS 257 and SELECT 146 signals from test controller 232, and outputs the EQO signal from the EQM 68 and ASM 40. The EQO multiplexer 235 is selected to output the CTERM 148 signal whenever a need exists to trigger an external circuit using the internal CTERM signal matching capabilities. When the ASM 40 is operating with other circuits that contain EQMs 68, the CTERMs 148 of multiple EQMs can be globally combined external to each input, to serve as a global qualification signal. The EQO multiplexer 235 is selected to output STATUS signals 257 whenever a need exists to monitor the internal state of the EQM by an external controller or when a need exists to use a status signal output for controlling or gating an external circuit on and off. Test controller 232 status that can be output from the EQO multiplexer includes: Test Running, End of Test, and Idle.

Scanable OPCODE register 236 stores a test OPCODE that controls the operation of test controller 232 and selects EQI input 70 or CTERM input 148 to be the event input to test controller 232. OPCODE 236 register receives serial input from TDI pin 48, control input from the test port bus 116, and control input from command register bus 140. OPCODE register 236 outputs test OPCODE 246 to test controller 232, selection control to event multiplexer 234, and serial data to scanable loop counter 238.

The scanable loop counter 238 repeats a test OPCODE input from OPCODE register 236 to test controller 232 a specified number of times. Loop counter 238 may be serially loaded with a count specifying the number of times a test OPCODE is to be repeated. The loop counter 238 receives serial input from scanable OPCODE register 236, a decrement loop count (DECLC) signal 254 from test controller 232, control input from test port bus 116, and control input from command register bus 140. Loop counter 238 outputs serial data to scanable event counter 240 and a loop count minimum (LPCMIN) signal 248 to test controller 232.

Scanable event counter 240 detects the nth occurrence of a particular event input. The event counter 240 may be reloaded from the event count memory 242 multiple times, allowing it to perform multiple count operations during EQM test operations. In some test monitoring operations it may be necessary to delay a test action (i.e. at test start, test pause, test stop) until a 2nd, 3rd, . . . or nth occurrence of the event input. The event counter 240 may be loaded with a count either serially from the test port or in parallel from the event count memory 242, specifying the number of event inputs that must occur before the test controller 232 reacts to an event input to execute a test OPCODE.

In addition to counting events, event counter 240 may be used in some EQM test operations to count clock inputs. For example, some EQM test operations use event counter 240 to perform test actions (i.e. delay test, do test, pause test) for a number of clock (CLK) cycles. During these test operations event counter 240 performs test actions for a predetermined number of clock cycles. Event counter 240 receives serial input from loop counter 238, decrement event count (DECEC) 256 and load count (LDCNT) 258 signals from test controller 232, parallel data input from event count memory 242, control input from test port bus 116, and control input from command register bus 140. Event counter 240 outputs serial data to the ASM 40 TDO pin 58, an event count minimum (ECMIN) signal 250 to the test controller 232, and parallel data to event count memory 242.

Event count memory 242 stores a plurality of event counts that can be loaded into event counter 240 to achieve a plurality of event or clock counting operations. The scanable event counter 240 serially reads and writes parallel data to and from event count memory 242 via test port 100. During test and after a current event count has reached a minimum value, test controller 232 outputs control to cause event count memory 242 to output a new count value to event counter 240 and control to cause event counter 240 to load the new count value from event memory 242 so that another event count operation may be performed. The event count memory 242 receives control input from command register bus 140, control input from test port 100 via bus 116, a next count (NXTCNT) signal 260 from test controller 232, and parallel data input from the scanable event counter 240. The event count memory 242 outputs parallel data to the scanable event counter 240.

Before an EQM controlled operation begins, OPCODE 236, LOOP COUNT 238 and event count 240 must be scanned in via test port 100. During a scan input operation, OPCODE 236, LOOP COUNT 238, and EVENT COUNT 240 scan path is accessed multiple times to load data into the EVENT COUNT MEMORY 242. During event count memory 242 load operations, the scan path and memory receive control from test port 100 to allow data to be serially shifted into event counter 240 of the scan path and then parallel loaded into memory 110.

After the scan path sections and memory 242 have been loaded, a command is scanned into command register 102 (FIG. 3) causing command register 102 to output an enable (ENA) signal to test controller 232. After test controller 232 receives the ENA signal, it reads the OPCODE input from OPCODE register 236 to determine the type of test operation to perform. EQM 68 can perform 10 types of test operations or protocols. U.S. patent application Ser. No.08/542,746, (TI-15423) and U.S. Pat. No. 5,353,308, (TI-15433) describe these test protocols in detail. Moreover, Table 1 provides a pseudo-code description of each EQM 68 test protocol.

TABLE 1

EQM TEST PROTOCOLS

Note 1: M = EQM loop count, and N = EQM event count.
Note 2: The word "test" refers to a PSA, sample or store operation.
Protocol 1 ---> For M times do
    Begin
        on Nth event do test
    End
    End of test
Protocol 2 ---> For M times do
    Begin
        During N events do test
    End
    End of test
Protocol 3 ---> For M times do
    Begin
        on Nth event do test
        on Nth event stop test
    End
    End of test
Protocol 4 ---> For M times do
    Begin
        On Nth event start test after N clocks
        On Nth event stop test
    End
    End of test
Protocol 5 ---> For M times do
    Begin
        On Nth event start test
        On Nth event stop test after N clocks
    End
    End of test
Protocol 6 ---> For M times do
    Begin
        On Nth event start test after N clocks
        On Nth event stop test after N clocks
    End
    End of test
Protocol 7 ---> For M times do
    Begin
        On Nth event do test for N clocks
    End
    End of test
Protocol 8 ---> For M times do
    Begin
        On Nth event
        Delay test for N clocks
        Do test for N clocks
    End
    End of Test
Protocol 9 ---> On Nth test do
    Do test for N clocks
    Then for (M-1) times do
        Pause for N clocks
        Do test for N clocks
    End
    End of Test
Protocol 10 ---> On Nth event, for M times do
    Begin
        Delay test for N clocks
        Do test for N clocks
    End
    End of Test During an EQM controlled test operation, test controller 232 monitors the event input from a signal input to initiate the test. The event input comes either from the CTERM input 148 from comparator 104 from the EQI input pin 70 via event multiplexer 234. In response to an event input, test controller 232 starts executing one of the test protocols listed in Table 1. During test execution, test controller 232 outputs control via bus 146 to TCR 112, memory 110, comparator 104, loop counter 238, event counter 240, and event count memory 242 to perform the test operation.

Figure 11:
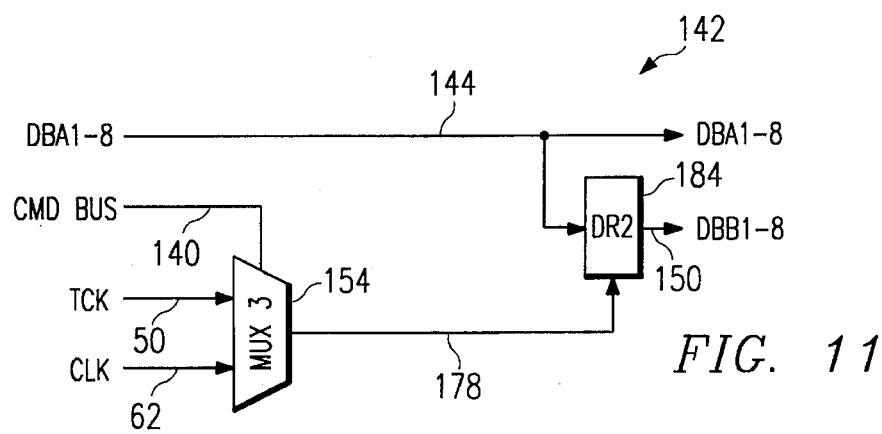
FIGS. 10 and 11 illustrate alternative embodiments of the present invention.
Figure 10:
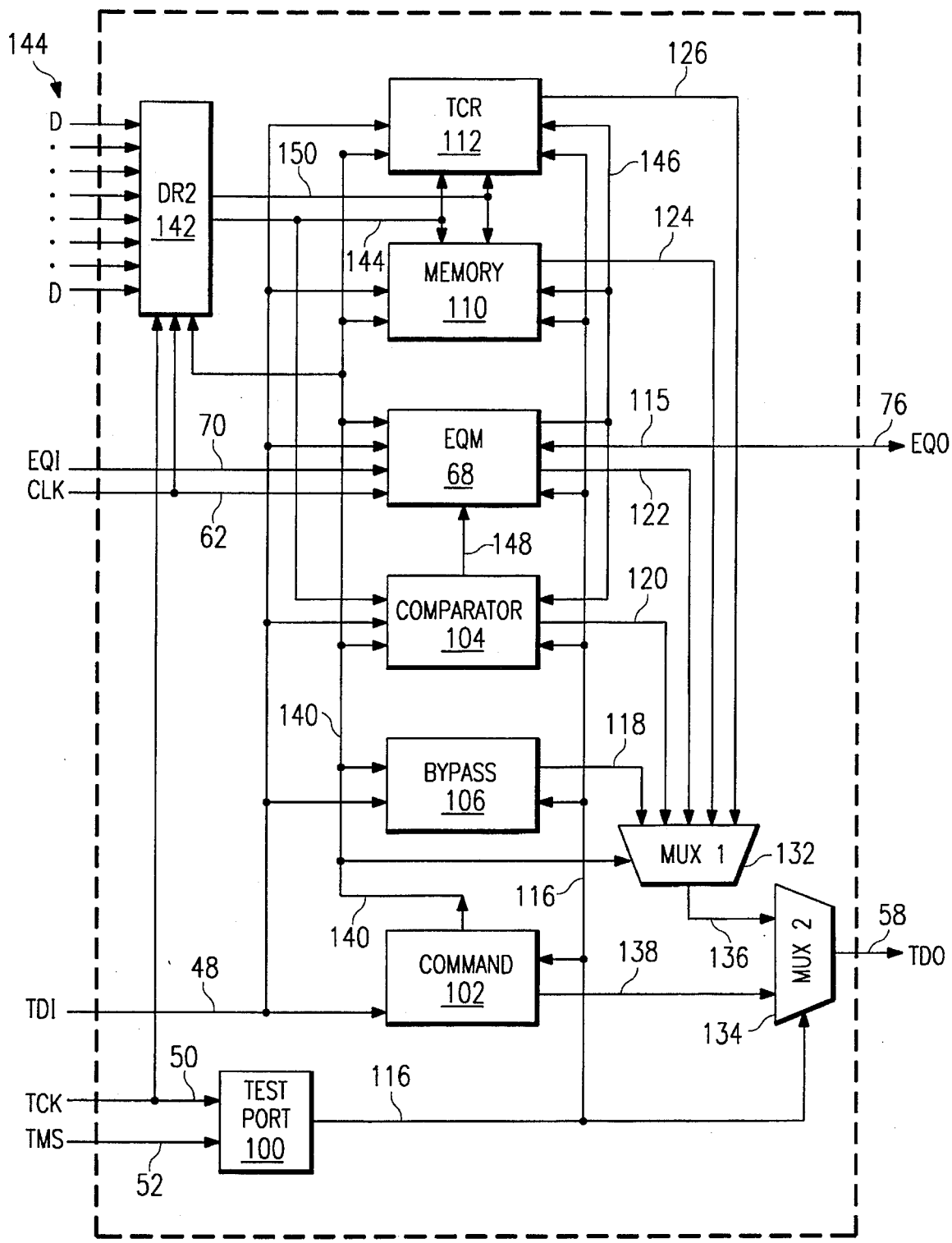

It is seen in FIG. 10 that converting the ASM architecture to monitor digital inputs is easily accomplished by extracting all circuitry in ADI 142 except for DR2 (see FIG. 11). Also the need for control register 114 is no longer necessary. The operation and purpose of DR2 142 is the same as described previously. DR2 142 receives digital signal inputs DBA1-8 144 and clocking control 178 from multiplexer 154. DR2 outputs data on DBB1-8 150 to TCR 112 and memory 110. DBA1-8 144 is input to TCR 112, memory 110, and comparator 104.

A digital bus monitor circuit has been previously described in U.S. patent application Ser. No. 07/892,392 entitled Digital Bus Monitor Integrated Circuits (TI-14124) by "Whetsel". However the TI-14124 Whetsel application can only qualify a test data store and/or compression operation in response to a received digital input pattern being exactly equal to an internally stored expected digital pattern.

The preferred embodiment, modified as shown in FIGS. 10 and 11, allows a test operation to be controlled in response to a received digital input pattern being: (1) equal to a stored expected value, (2) greater than a stored expected value, (3) greater than or equal to a stored expected value, (4) less than a stored expected value, (5) less than or equal to a stored expected value, (6) less than or equal to one stored expected value and greater than or equal to another stored expected value (i.e. within a window bounded by two digital number values), or (7) either greater than one stored expected value or less than another stored expected value (i.e. outside of a window bounded by two digital number values).

This expanded qualification capability improves the ability for a digital signal monitoring circuit to qualify test operations. Using the digital monitoring circuit of the present invention, it is possible to qualify a data store and/or compression operation in response to a processor's address bus being within a certain address range instead of only at a particular address location.

For example, the embodiment of FIGS. 10 and 11 can qualify a test in response to a received digital address being greater than a stored expected address. Another example of the improvement that this embodiment affords is the ability to qualify a test in response to a received digital address being greater than or equal to a stored expected address. Yet another example of an improvement that this embodiment affords is the ability to qualify a test in response to a received digital address being less than a stored expected address. A further example improvement that this embodiment affords is the ability to qualify a test in response to a received digital address being less than or equal to a stored expected address. Another example of the improvement that this embodiment affords is the ability to qualify a test in response to a received digital address input being inside an address window bounded by stored expected upper and lower address limits. One more example improvement of this embodiment is the ability to qualify a test in response to a received digital address input being outside an address window bounded by stored expected upper and lower address limits.

Description of Operation.

The following is a description of how ASM 40 of the preferred embodiment operates when one of its instructions has been scanned into command register 102. In the instructions, the prefix EC refers to test operations that operate from External Control output from test port 100, and the prefix IC refers to test operations that operate from Internal Control output from EQM 68. The terms V1 and V2 in the instructions refer to two of the analog signal inputs ASI-1 through ASI-n. Signal V1 is the selected output from ADI multiplexer 1 156 and signal V2 is the selected output from ADI multiplexer 2 158 (See FIG. 4). Selection control for signals V1 and V2 are input to ADI 142 from control register 114. When an instruction is shifted into command register 102, command register outputs control via control bus 140 to either enable a test operation or perform a scan operation through one of the data register scan paths: 104, 106, 68, 110, 112, or 114.

EC SAMPLE V1: Externally Controlled Sample of Analog Signal V1

During this test instruction, TCR 112 receives control from the external test bus via test port 100 and control bus 116 to CAPTURE the digitized analog data output from ADI 142 during CAPTUREDR State 216. The data captured is a digital representation of a voltage input on one of the selectable inputs 1-n. After the data is captured, it is shifted out of TCR 112 and ASM 40 via TDO 58 for inspection during SHIFTDR state 218.

IC SAMPLE Vi: Internally Controlled Sample of Analog Signal V1

During this test instruction, TCR 112 receives control from internal EQM 68 via EQM control bus 146 to capture the digitized analog data output from the ADI 142. The data captured is a digital representation of the voltage input on one of the selectable analog inputs 1-n. After the data is captured, it can be shifted out of TCR 112 for inspection via a Read TCR instruction.

EC SAMPLE V1-V2: Externally Controlled Sample of the Difference Between Analog Signals V1 and V2

During this inspection, TCR 112 receives control from the external test bus via test port 100 and control bus 116 to capture the digitized analog data output from ADI 142 during CAPTUREDR state 216. The data captured is a digital representation of the voltage difference between selected analog signals V1 and V2. After the data is captured, it is shifted out of TCR 112 and ASM 40 via TDO 58 for inspection during SHIFTDR state 218.

IC SAMPLE V1-V2: Internal Controlled Sample of the Difference between Analog Signals V1 and V2

During this test instruction, TCR 112 receives control from the EQM 68 via EQM control bus 146 to capture the digitized analog data output from ADI 142. The data captured is a digital representation of the voltage difference between analog signals V1 and V2. After the data is captured, it can be shifted out of TCR 112 for inspection via a Read TCR instruction.

EC PSA VI: Externally Controlled PSA of Analog Signal V1

During this parallel signature analysis (PSA) test instruction, TCR 112 receives control from the external test bus via test port 100 and control bus 161 to compress the digitized data output from ADI 142 during RI/IDLE state 212. The data compressed is a digital representation of the voltage input on one of the selectable analog inputs 1-n over a period of time. After the data is compressed, it can be shifted out of TCR 112 for inspection via a Read TCR instruction.

IC PSA V1: Internally controlled PSA of Analog Signal V1

During this PSA test instruction, TCR 112 receives control from EQM 68 via EQM control bus 146 to compress the digitized analog data output from the ADI 142. The data compressed is a digital representation of the voltage input of one of the selectable analog inputs 1 through n over a period of time. After the data is compressed, it can be shifted out of TCR 112 for inspection via a Read TCR instruction.

EC PSA V1-V2: Externally Controlled PSA of the Difference Between Analog Signal V1 and V2

During this PSA test instruction, TCR 112 receives control from the external test bus via test port 100 and control bus 116 to compress the digitized analog data output from ADI 142 during RT/IDLE state 212. The data compressed is a digital representation of the voltage difference between analog signals V1 and V2 over a period of time. After the data is compressed, it can be shifted out of TCR 112 for inspection via a Read TCR instruction.

IC PSA V1-V2: Internally Controlled PSA of the Difference Between Analog Signal V1 and V2

During this PSA test instruction, TSR 112 receives control from the EQM 68 via EQM control bus 146 to compress the digitized analog data output from ADI 142. The data compressed is a digital representation of the voltage difference between the analog signals V1 and V2 over a period of time. After the data is compressed, it can be shifted out of TCR 112 for inspection via a Read TCR instruction.

EC STORE V1: Externally Controlled Storage of the Analog Signal V1

During this test instruction, the memory 110 receives control from the external test bus via test port 100 and control bus 116 to store the digitized analog data output from ADI 142 during RT/IDEL state 212. The data stored is a digital representation of the voltage input on one of the selectable inputs 1 through n over a period of time. After the data has been stored, the memory contents can be shifted out for inspection via a Read memory instruction.

IC STORE VI: Internally Controlled Storage of Analog Signal V1

During this test instruction, memory 110 receives control from the EQM 68 via EQM control bus 46 to store the digitized analog data output from ADI 142. The data stored is a digital representation of the voltage input on one of the selectable analog inputs 1 through n over a period of time. After the data has been stored, memory 110 contents may be shifted out for inspection via a Read memory instruction.

EC STORE V1-V2 Externally Controlled Storage of the Difference between Analog Signals V1 and V2

During this test instruction, memory 110 receives control from the external test bus via test port 100 and control bus 116 to store the digitized analog data output from ADI 142 during RT/IDLE state 212. The data stored is a digital representation of the voltage between analog signals V1 and V2 over a period of time. After the data has been stored, memory 110 contents may be shifted out for inspection via a Read Memory instruction.

IC STORE V1-V2: Internally Controlled Storage of the Difference Between Analog Signals V1 and V2

During this test instruction, the memory 112 receives control from EQM 68 via EQM control bus 146 to store the digitized analog data output from ADI 142. The data stored is a digital representation of the voltage difference between analog signal V1 and V2 over a period of time. After the data has been stored, the memory contents can be shifted out for inspection via a Read Memory instruction.

EC PSA/STORE V1: Externally Controlled PSA and Storage of the Analog Signal V1

During this test instruction, TCR 112 and memory 110 will receive control from the external test bus via test port 100 and control bus 116 to compress and store, respectively, the digitized analog data output from ADI 142 during RT/IDLE state 212. The data compressed and stored is a digital representation of the voltage input on one of the selectable analog inputs 1 through n over a period of time. After the data has been compressed into TCR 112 and stored into the memory 110, it can be shifted out for inspection by executing a Read TCR instruction to access the signature in TCR 112, followed by a Read Memory instruction to access the memory 110 contents.

IC PSA/STORE V1: Internally Controlled PSA and Storage Analog Signal V1

During this test instruction, TCR 112 and memory 110 receive control from EQM 68 via EQM control bus 146 to compress and store, respectively, the digitized analog data output from ADI 142. The data compressed and stored is a digital representation of the voltage input on one of the selectable analog inputs 1-n over a period of time. After the data has been compressed into the TCR 112 and stored into memory 110, it may be shifted out for inspection by executing a Read TCR instruction to access the signature in TCR 112, followed by a Read memory instruction to access the memory contents.

EC PSA/STORE V1-V2: Internally Controlled PSA and Storage of the Difference Between Analog Signals V1 and V2

During this test instruction, TCR 112 and memory 110 receive control from external test bus via test port 100 and control bus 116 to compress and store, respectively, the digitized analog data output from ADI 142 during RT/IDLE state 212. The data compressed and stored is a digital representation of the voltage difference between analog signals V1 and V2 over a period of time. After the data has been compressed into the TCR 112 and stored into memory 110, it may be shifted out for inspection by executing a Read TCR instruction to access the signature in TCR 112, followed by a Read memory instruction to access the memory 110 contents.

IC PSA/STORE V1-V2: Internally Controlled PSA and Storage of the Difference Between Analog Signals V1 and V2

During this test instruction, TCR 112 and memory 110 receive control from EQM 68 via EQM control bus 146 to compress and store, respectively, the digitized analog data output from ADI 142. The data compressed and stored is a digital representation of the voltage difference between analog signals V1 and V2 over a period of time. After the data has been compressed into the TCR 112 and stored into memory 110, it may be shifted out for inspection by executing a Read TCR instruction to access the signature in TCR 112, followed by a Read memory instruction to access the memory 110 contents.

Serialize TCR: During the serialize TCR instruction, TCR 112 receives control from the serializer 204 and test port 100 to repetitively parallel load and shift out digitized analog voltage measurements from ASM 40 via TDO output 58, during SHIFTDR state 218.

Read TCR: During the read TCR instruction, the TCR 112 receives control from the external test bus via test port 100 to shift out the current data value in TCR 112 from the ASM 40 TDO output pin 58 during SHIFTDR state 218. This instruction is used to access the signature stored in TCR 112 from a previous analog PSA instruction. During this instruction, the CAPTUREDR state 216 is disabled to allow the existing value in TCR 112 to be shifted out.

Scan EQM: During the scan EQM instruction, EQM 68 receives control from the external test bus via the test port 100 to shift data from TDI input 48, through the EQM 68 scan path to TDO output 58. This instruction is used to load control information into the EQM controller 68 so that an event qualified test monitor operation may be executed.

Scan Control Register: During the scan control register instruction, control register 114 receives control from the external test bus via the test port 100 to shift data from TDI input 48, through the control register scan path, to TDO output 58. This instruction is used to load control information into the control register to setup ADI 142 for an analog test operation.

Scan Bypass Register: During the scan bypass register instruction, the bypass register 106 receives control from the external test bus via test port 100 to shift data from TDI input 48, through the bypass scan cell, and out of the ASM 40 via the TDO output pin 58. This instruction is used to shorten the scan path through ASM 40 to only a single scan cell or flip flop.

Write Comparator Memory: During the write comparator memory instruction, comparator 104 receives control from the external test bus via test port 100 and control bus 116 to accept serial data input to ASM 40 from TDI pin 48, convert the data into a parallel data format, then write the data into the comparators expected data and compare select memory 220.

Read Comparator Memory: During the read comparator memory instruction, comparator 104 receives control from the external test bus via test port 100 to convert the parallel data output from the expected data and compare select memory into a serial format, then shift the serial data out of the ASM 40 via TDO output 58.

Write Storage Memory: During the write storage memory instruction, memory 110 receives control from the external test bus via test port 100 to accept serial data input to ASM 40 from TDI input pin 58, converted it into a parallel data format, then write the data into the storage memory.

Read Storage Memory: During the read storage memory, memory buffer 110 receives control from the external test bus via the test port 100 to convert the parallel data output from the storage memory 110 into a serial format, then shift the serial data out of ASM 40 via the TDO output 58.

Serializer Circuit Application for Data Register Scan Operations.

The following describes the advantages of using serializer circuit 204 in FIG. 6 over using the data register scan operations of IEEE 1149.1 to non-intrusively monitor analog circuits by loading and shifting out multiple digitized analog signals from an ASM to a test bus controller.

Figure 12:
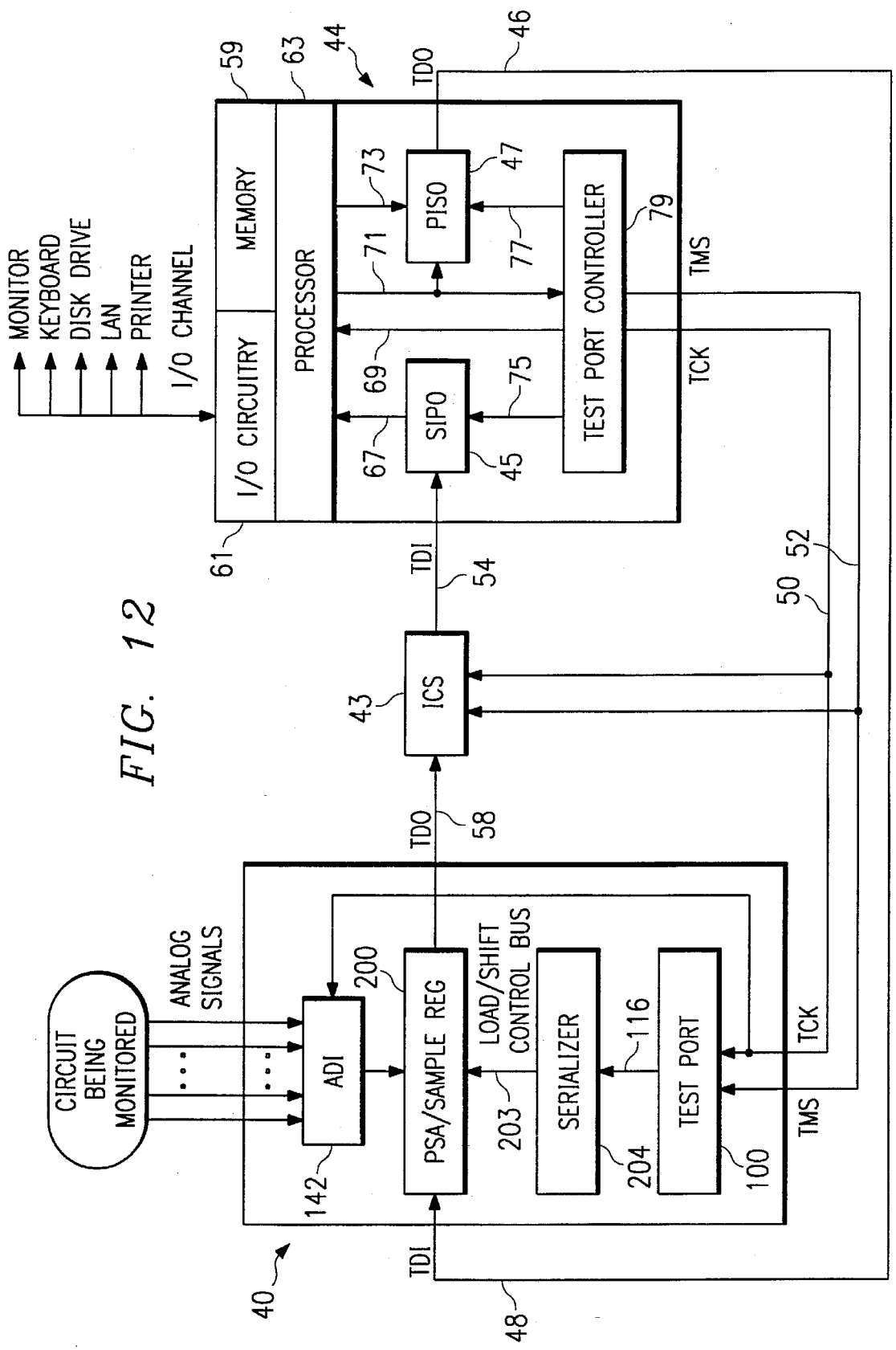
FIG. 12 illustrates a simplified block diagram of the analog signal monitoring circuit together with a detailed view of a test bus controller to illustrate the operation of the serializer circuit of the preferred embodiment.

FIG. 12 provides a simplified block diagram of ASM 40 together with a more detailed block diagram of test bus controller 44. ASM 40 is directly coupled to TMS 52 and TCK 50 control signals and TDO data output signal 48 of test bus controller 44. ASM 40 couples to TDI input 54 of test bus controller 44 through a series of integrated circuits (ICs) 43 that contain the IEEE 1149.1 scan architecture. ASM 40 consists of ADI 142, PSA/sample Register 200, Serializer 204, and Test Port 100. ADI 142 receives multiple analog signal inputs from a circuit to be monitored and the TCK input from the test bus controller. ADI 142 outputs parallel digitized representations of a selected one of the analog inputs to the PSA/sample Register 200. The PSA/sample Register 200 receives parallel digitized analog input from ADI 142, load/shift control from the serializer 204, and serial data input from test bus controller 44 via the TDI input. PSA/sample Register 200 outputs serial data on TDO output 58 to test bus controller 44, via intermediate ICs 43.

Test bus controller 44 comprises of processor 63, memory 59, I/O circuitry 61, serial input parallel output (SIPO) register 45, parallel input serial output (PISO) register 47, and test port controller circuit 79. Processor 63 couples to memory 59 and I/O circuitry 61 via an internal bussing structure not detailed in FIG. 12. Memory 59 stores test programs that processor 63 executes and test data that test bus controller 44 produces from ASM 40 during a test operation. I/O circuitry 61 provides an input and output method of allowing test bus controller 44 to communicate to external peripherals such as monitors, keyboards, disk drives, local area networks, and printers. Processor 63 receives parallel test data input from SIPO 45 via bus 67, and status input from test port controller 79 via bus 69. Processor 63 outputs parallel test data to PISO 47 via bus 73 and control data to test port controller 79 and PISO 47 via bus 71. SIPO 45 receives control input from the test port controller 79 via bus 75 and serial data input from ASM 40 and ICs 43, via the TDI input 54, and outputs parallel data to processor 63 via bus 67. PISO 47 receives parallel data and load control input from processor 63 via bus 73 and control input from the test port controller 79 via bus 77, and outputs serial data to ASM 40 via the TDO output 48. Test port controller 79 receives control input from processor 63 and outputs control to SIPO 45 via bus 75, control to PISO 47 via BUS 77, status to processor 63 via bus 69, and control to ASM 40 via signals TMS 52 and TCK 50.

While test bus controller 44 may receive and output serial data to devices on the IEEE 1149.1 test bus, this description focuses on the use of test bus controller 44 to receive digitized analog signal input from the ASM 40.

Analog Signal Monitoring Using IEEE 1149.1 Data Register Scan Operations

During analog signal monitoring operations using the IEEE 1149.1 standard, processor 63 inputs control to test port controller 79 to execute a data register scan cycle. Also serializer 204 of ASM 40 disables to allow the output bus 116 of test port 100 to couple to PSA/sample register 200 via the serializer load/shift control bus 203. In response to control input from processor 63, test port controller 79 outputs control to test ports 100 of ASM 40 and ICs 43 via the TMS 52 and TCK 50 signals to cause test ports 100 to output control to cause data to be parallel loaded into a selected data register of ASM 40 and ICs 43.

ICs 43 have been set up prior to the monitor operation to select their bypass data register (see bypass register 106 of FIG. 3), so the scan path length through each IC 43 is one bit per IC. Also the ASM 40 PSA/sample register 200 has been selected prior to the monitor operation so the scan path length through the ASM 40 equals the length of PSA/sample register 200. After parallel data has been loaded into the bypass bits of ICs 43 and PSA/sample register 200, test port controller 79 outputs control to shift the data in PSA/sample register 200 out of ASM 40, through the ICs 43, and into the SIPO 45 of the test bus controller 44.

To execute one monitor operation, test bus controller 44 must output control to cause the test ports 100 of ASM 40 and ICs 43 to transition from the RT/IDLE state, through all required data register scan states shown in FIG. 7 (SELDRS, CAPTUREDR, SHIFTDR, EXIT1DR, & UPDATEDR), and then return the RT/IDLE state so that the processor can read the data shifted into the SIPO 45 via parallel bus 67.

During each monitor sequence, the parallel data from ADI 142 is captured into the PSA/sample register 200 when the ASM test port 100 transitions from the CAPTUREDR state into the SHIFTDR state. The captured data in PSA/sample register 200 is shifted out to test bus controller 44 via ICs 43 while test port 100 is in the SHIFTDR state.

After the data has been shifted out of the PSA/sample register 200, through ICs 43, and into the SIPO 45, test port controller 79 outputs control to place the test port 100 in ASM 40 and ICs 43 back into the RT/IDLE state and signals processor 63 via bus 69 that the monitor operation is complete. When the processor 63 receives the complete signal from the test port controller 79, it reads the parallel data in the SIPO 45, stores it for later processing, and repeats the IEEE 1149.1 data register scan sequence again to receive another digitized analog input pattern from the ASM 40.

Assuming, for example, 100 ICs between TDO output 58 and TDI input 54, an 8-bit PSA/sample register 200, an 8-bit SIPO 45, and a TCK frequency of 10 Mhz, the test time to take 100,000 digitized samples of an analog signal using multiple IEEE 1149.1 data register scan cycles may be calculated according to equations (11) and (12). Equation (13) shows the maximum rate that an analog signal can be sampled or measured using IEEE 1149.1 data register scan cycles.

$$\text{TCKs/Scan Cycle} = \text{SELDRS} + \text{CAPTUREDR} + (\text{SHIFTDR} \times \text{Scan Path Length}) + \text{EXIT1DR} + \text{UPDATEDR} + \text{RT/IDLE} \quad (11)$$

Where: SELDRS, CAPTUREDR, SHIFTDR, EXIT1DR, UPDATEDR, RT/IDLE = 1 TCK each

Scan Path Length = PSA/sample Register + 100 ICs + SIPO

PSA/sample Register Length = 8 bits

SIPO Length = 100 bits $$\begin{aligned}\text{Test Time} &= (\text{Eq. 11}) \times (\text{\# of Scan Cycles}) \times (1/\text{TCKfreq}) \quad (12)\\ &= (1 + 1 + 116 + 1 + 1 + 1) \times (100{,}000) \times (1/10 \text{ Mhz})\\ &= 1.2 \text{ seconds}\end{aligned}$$

$$\begin{aligned}\text{Analog Sample Rate} &= (\text{Eq. 11}) \times (1/\text{TCKfreq}) \quad (13)\\ &= 121 \text{ ms} \times 1/10 \text{ Mhz}\\ &= 12.1 \text{ microseconds}\end{aligned}$$

Analog Signal Monitoring Using the Serializer Circuit

During analog signal monitoring operations using the serializer circuit 204 of ASM 40, test bus controller 44 only has to perform one extended IEEE 1149.1 data register scan operation. Prior to the analog monitor operation, serializer 204 will be enabled to output control to PSA/sample register 200 to capture and shift out digitized analog patterns. The monitor operation is started by processor 63 inputting control to test port controller 79 to execute an extended data register scan cycle. In response to the processor's control input, test port controller 79 outputs control to the test port 100 of ASM 40 and ICs 43 via the TMS 52 and TCK 50 signals to cause the test port 100 to transition into the CAPTUREDR state and output control to parallel load data into their selected data register, the bypass registers in ICs 43 and the PSA/sample register 200 in ASM 40.

In ASM 40, test port 100 outputs control to serializer 204 which responds by outputting control to PSA/sample register 200 to capture the digitized analog output from the ADI 142. The ICs 43 have been set up prior to the monitor operation to select and capture data into their bypass data register, so the scan path length through each ICs 43 is one bit per IC. After the parallel data has been loaded into the bypass bits of ICs 43 and PSA/sample register 200 of ASM 40, test bus controller 44 outputs control to cause the test port 100 in ASM 40 and ICs 43 to enter the SHIFTDR state and output control to start shifting data to TDI input 54. Before data in the PSA/sample register 200 reaches TDI input 54 of the test bus controller 44 it must first be shifted through the bypass registers of ICs 43. Test port 100 in ICs 43 control the shift out operation of bypass registers in ICs 43, and serializer 204 controls the shift out operation of the PSA/sample register 200 in the ASM 40.

After serializer 204 shifts out the last bit of the first digitized analog pattern from PSA/sample register 200, serializer 204 outputs control to cause the PSA/sample register 200 to load the next digitized analog pattern output from the ADI 142, and continues the shift out operation with the new digitized analog pattern. Serializer 204 repeats the steps of (1) capturing parallel output data from ADI 142 into the PSA/sample register 200 and (2) shifting out the captured data from the PSA/sample register 200 to SIPO 45 via the ICs 43 while the test port controller 79 outputs control to keep test ports 100 of the ASM 40 and ICs 43 in the SHIFTDR state.

When the SIPO 45 receives the first digitized analog pattern from ASM 40, test port controller 79 signals processor 63 via bus 69 to read and store the data from the SIPO 45 into memory 59 for later processing. After the first read operation, processor 63 waits for test port controller 79 to signal when the next pattern is received. Test port controller 79 then reads and stores the next pattern. Test port controller 79 is programmed by input from processor 63 to know how many TCK bus cycles are necessary for the first digitized analog pattern to be shifted from ASM 40, through ICs 43, and into the SIPO 45. So test port controller 79 delays the first read signal to processor 63 for a predetermined number of TCK bus cycles to allow the digitized analog pattern to be received in SIPO 45. After the first pattern is received, test port controller 79 signals processor 63 to read subsequent digitized analog patterns from SIPO 45 and store them into memory 59 at regular intervals equal to the width of the digitized analog pattern received.

Other methods of determining when processor 63 starts reading patterns from SIPO 45 may be used. For example, PSA/sample register 200 may be designed to initially output a start bit pattern or header as the first pattern instead of a digitized analog pattern. SIPO 45, then, may be designed to recognize when this start header is received and output a read signal to processor 63 to start reading data from SIPO 45. After the first read signal is input to processor 63, it knows to reread the SIPO 45 at regular intervals determined by the bit length of the pattern output from PSA/sample register 200.

This alternate method works because the bypass bits of the ICs 43 between the ASM 40 and test bus controller 44 load with logic zeros during the CAPTUREDR state of the data register scan operation. Thus the test bus controller receives a stream of logic zero bits prior to receiving the start header pattern from ASM 40. The start header pattern, in the preferred embodiment, is a fixed bit length (equal to the length of PSA/sample register 200) input sequence containing at least one logic one bit.

If test bus controller 44 needs to pause, the shift operation of the extended 1149.1 data register scan cycle, processor 63 outputs control to test port controller 79 via bus 71 to cause test port controller 79 to output control on the TMS 52 and TCK 50 signals. This places test ports 100 in ASM 40 and ICs 43 in the PAUSEDR state. The shifting operation is resumed when processor 63 inputs control to test port controller 79 to output control to cause the test ports 100 in ASM 40 and ICs 43 to re-enter the SHIFTDR state.

After test bus controller 44 receives a predetermined number of digitized analog pattern inputs from ASM 40, processor 63 inputs control to test port controller 79 to terminate the extended data register scan operation by outputting control to test ports 100 of ASM 40 and ICs 43. The termination control received by ASM 40 and ICs 43 causes their test ports to transition from the SHIFTDR state to the EXIT1DR state and into the RT/IDLE state via the UPDATEDR state. When the serializer 204 of ASM 40 sees test port 100 transition out of the SHIFTDR state, it terminates the steps of capturing data from ADI 142 and shifting data out of PSA/sample register 200.

Assuming 100 ICs between ASM's TDO 58 output and test bus controller's TDI 54 input, an 8-bit PSA/sample register, an 8-bit SIPO, and a TCK frequency of 10 Mhz, the test time to take 100,000 digitized samples of an analog signal using the serializer and one extended IEEE 1149.1 data register scan cycle can be calculated using Equations (14) and (15). Equation (16) shows the maximum rate that an analog signal may be sampled or measured using serializer 204.

TCKs/Test = Scan Path Length + (PSA/sample register length × # of samples)  (14)

Where: Scan Path Length = PSA/sample Register + 100 ICs + SIPO

PSA/sample Register Length = 8 bits

SIPO length = 8 bits

100 ICs length = 100 bits samples = 100,000

Test Time = (TCKs/Test) × (1/(TCK freq))  (15)

Test Time = (116 + (8 × 100,000)) × (1/10 Mhz) = .080 seconds

Analog Sample Rate = PSA/sample register length × (1/TCKfreq)  (16)

Analog Sample Rate = 8 × (1/10 Mhz) = 0.8 microseconds

Comparison Between Analog Monitoring Methods

The advantages of using the serializer method instead of the IEEE 1149.1 method to output multiple digitized analog patterns from an ASM to a test bus controller are clearly shown. Comparing the test time to monitor 100,000 digitized analog patterns using the serializer approach (0,080 seconds in the example) and the IEEE 1149.1 approach (1.2 seconds in the example) results in a test time reduction of 93% using serializer 204. Comparing the analog sample rates between the serializer approach (0.8 microseconds) and the IEEE 1149.1 approach (12.1 microseconds) results in an increase in sample rate of 93% using the serializer.

The benefit of reduced test time that serializer 204 provides, is that the test can be completed in a shorter time frame. In both IC and system level test environments, reducing the test time of a product results in an increased number of products that may be manufactured in a given time frame. Being able to produce more products in a given time frame results in a lower product cost due to lower manufacturing cost associated with the labor and equipment required to manufacture and test the product. Also, since the serializer technique is embedded in the product (i.e., an IC or system) a test may be reapplied in a field environment for test and maintenance purposes. Being able to quickly test and maintain a product in its field environment, further reduces the cost of the product by decreasing the life cycle cost of the product.

The benefit of the increased analog sample rate provided by the serializer, is that more information about the analog signal can be obtained over a fixed amount of time than possible using the IEEE 1149.1 approach. For example, if an analog signal is sinusoidal, the frequency of the sampling rate of the analog signal needs to be significantly greater than the frequency of the sinusoidal signal to allow gathering enough information to determine if the shape and amplitude of the waveform is correct. The increased sample rate of the serializer approach over the IEEE 1149.1 approach allows the test bus controller to obtain more information on an analog signal being monitored over a given time frame. With the additional information made available by the serializer, the test bus controller can process and test the signal more accurately than using the IEEE 1149.1 approach.

In some instances, the test bus controller may be programmed to operate as an oscilloscope or chart recorder, to reconstruct an analog signal, based on information received from the ASM, and display the reconstructed signal on a video monitor or output it on a printer, as illustrated in FIG. 12, to provide a visual representation of the tested signal. Since the serializer method provides more information about an analog signal over a fixed time frame than the IEEE 1149.1 method, reconstructed visual representations based on information obtained using the serializer are more detailed and accurate than using the IEEE 1149.1 approach.

ASM 40 of FIG. 12 comprises circuitry for translating analog signals into a digital pattern (ADI 42), circuitry for parallel loading the digital pattern and shifting it out (PSA/ sample register 200), and circuitry for controlling the parallel load and shift out operation in response to control input from the test port 100 (serializer circuitry 204). As such, ASM 40 forms an analog test transmitter. Test bus controller 44 of FIG. 12 consists of circuitry for controlling the operation of the transmitter (test port controller 79), circuitry for receiving serial input from the transmitter and outputting the received data in parallel (SIPO 45), and circuitry for controlling the test port controller, storing received data into a memory, and processing the received data. As such, test bus controller 44 forms an analog test controller/receiver, Analog test transmitters may be included in any circuit design, such as sub-circuits in an IC, multiple chip modules, multiple ICs or multiple chip modules on a board, or multiple boards in a system, to provide an embedded test monitoring capability for analog circuits. Test bus controller 44 may be interfaced with the analog test transmitters through the IEEE 1149.1 test bus or other interface bus to monitor embedded analog circuits.

Thus, the combination of the analog test controller/receiver and one or more analog test transmitters form a testing system that may be used to non-intrusively monitor analog circuits in any environment; IC test, board test, system test, field service, etc. In addition to controlling analog test transmitters to output digitized analog test data, test bus controller 44 also processes the data to determine if the analog circuits are operating properly. Moreover, test bus controller 44's ability to reconstruct the analog signal from the data it receives and output the reconstructed signal to a video monitor allows the analog test system to emulate an oscilloscope test instrument.

While the present invention has been described as being a packaged test integrated circuit that can be added to a board design comprising other packaged functional integrated circuits, it should be understood that it could also be an unpackaged test integrated circuit (die) mounted on a common substrate comprising other unpackaged functional integrated circuits (die), or it could be a testing subcircuit in an integrated circuit comprising other functional subcircuits.

Although the preferred embodiment has been described in detail, it should be understood that various changes, substitutions and alterations can be made herein without departing form the spirit and scope of the invention as defined in the appended claims.

What is claimed is:

1. A serializer circuit for loading and shifting out multiple packets of digitized analog signals, comprising:

translation circuitry for translating an analog signal into a digital representation of said analog signal, said digital representation comprising a plurality of binary bit positions;

a register for receiving, shifting and loading said digital representations;

load/shift control circuitry for loading said digital representations into said register and for serially shifting said digital representations out of said register;

a receiver circuit for serially receiving multiple packets of said digital representations of said digitized analog signals from said register;

said translation circuitry comprising circuitry for translating said analog signal into said digital representation while said load/shift control circuitry continuously loads and shifts said register to output a plurality of digital representations of said translated analog signals;

said receiver circuit comprising a receive register for receiving and storing a predetermined number of serial data bit positions and a parallel memory for storing the contents of said register; and further comprising control circuitry for storing the contents of said receive register into said parallel memory without interrupting the operation of said receiver circuit.

2. The serializer circuit of claim 1, further comprising circuitry for selectively shifting said serial shifted digital representations from said serializer circuit to said receiver circuit either directly or through a plurality of predetermined circuits, said predetermined circuits positioned on a serial path between said serializer circuit and said receiver circuit.

3. The serializer circuit of claim 1, further comprising circuitry for delaying said receiving and storing operation of said receiver register until said serial data bit positions pass through a predetermined number of intermediate circuits and are serially input to said receiver circuit.

4. The serializer circuit of claim 1, further comprising circuitry for testing whether said analog signals fall within a predetermined range.

5. A transmitter test circuit controlled by a serial bus for serially transmitting multiple packets of digital representations of analog signal measurements, comprising:

an analog to digital interface circuit for receiving analog signals and outputting digital representations of said analog signals;

a sample register enabled by control inputs from said serial bus for receiving and shifting out said digital representations;

a serializer circuit associated with said sample register, said serializer circuit further comprising a control circuit for loading said digital representations into said sample register and shifting said digital representations from said sample register, and a counter circuit for counting the number of shifting operations performed in said sample register before the next load operation can occur, said loading and shifting of said digital representations occurring cyclically once enabled by said control inputs from said serial bus.

6. The transmitter test circuit of claim 5, further comprising a load/shift control multiplexer associated with said serializer circuit for selectively controlling inputs to said sample register, said load/shift control multiplexer associated to receive selection control input to control the digital representation flow into said sample register.

7. The transmitter test circuit of claim 5, wherein said sample register selectively permits compressing multiple parallel flow of said digital representations into said sample register.

8. The transmitter test circuit of claim 5, further comprising a test bus controller for receiving serial data from and outputting serial data to said serializer circuit.

9. The transmitter test circuit of claim 8, wherein said test bus controller is associated with a memory for storing a plurality of test programs and storing a plurality of said digital representations from said transmitter circuit.

10. The transmitter test circuit of claim 9, further comprising a processor associated with said memory and said test bus controller for executing a plurality of said stored test programs.

11. A transmitter test circuit controlled by a serial bus for serially transmitting multiple packets of digital representations of analog signal measurements, comprising;
- an analog to digital interface circuit for receiving analog signals and outputting digital representations of said analog signals;
- a sample register enabled by control inputs from said serial bus for receiving and shifting out said digital representations;
- a serializer circuit associated with said sample register, said serializer circuit further comprising a control circuit for loading said distal representations into said sample register and shifting said digital representations from said sample register, and a counter circuit for counting the number of shifting operations performed in said sample register before the next load operation can occur, said loading and shifting of said digital representations occurring cyclically once enabled by said control inputs from said serial bus; and
- a test bus controller coupled to said serial bus, wherein said test bus controller comprises:
  input/output circuitry;
  a memory;
  a serial input parallel output register;
  a parallel input serial output register;
  a test port controller circuit;
  a processor wherein said processor couples to said memory and said input/output circuitry for controlling operations of said memory and said input/output circuitry, said memory providing storage for a plurality of test programs executed by said processor and further serving as storage for test data from said sample register and said serializer circuit, said input/output circuitry for allowing said test bus controller to communicate to a plurality of external integrated circuits;
- said serial input parallel output register for receiving control input from said test port controller and serial data input from said sample register and said serializer circuit and outputting parallel data to said processor; and
- wherein said parallel input serial output register receives parallel data and input from said processor and control input from said test port controller and outputs serial data to said sample register and said serializer circuit, and further wherein said test port controller receives control input from said processor and outputs control to said serial input parallel output register, outputs control to said parallel input serial output register, outputs status information to said processor, and outputs control signals to said sample register and said serializer circuit.

12. A method for loading and shifting out multiple packets of digitized analog signals, comprising the steps of:
- translating analog signals into digital representations of said analog signals, said digital representations each comprising a plurality of binary bit positions;
- loading said digital representations into a transmit register operable to store and shift said digital representations;
- shifting said digital representations out of said transmit register; and
- serially receiving multiple packets of said digital representations of said analog signals into a receive register and storing said multiple packets into a parallel memory, wherein said digital representations of said analog signals are serially received by shifting a predetermined number Of bits into said receive register, and storing the contents of said receive register in said parallel memory after said receive register has received a predetermined number of serial bit positions; and
- storing the contents of said receive register into said parallel memory without interrupting the shifting operation of said transmit and receive registers.

13. The method of claim 12, further comprising the step of translating said analog signals into said digital representations while continuously loading and shifting out a plurality of previously translated analog signals from said transmit register.

14. The method of claim 12, further comprising the step of selectively shifting said digital representations from said transmit register either directly or through a plurality of predetermined circuits in a serial path between said transmit register and said receive register.

15. The method of claim 12, further comprising the step of delaying shifting of said digital representations into said receive register until said predetermined number of serial data bit positions pass through a predetermined number of intermediate circuits and are serially input into said receive register.

16. The method of claim 12, further comprising the step of testing whether said received analog signals fall within a predetermined range of values.

17. A method for serially transmitting multiple packets of digital representations of analog signal measurements responsive to a serial bus, comprising the steps of:
- sampling the analog signal and translating the analog signal into digital representations;
- loading said digital representations into a sample register operable to store and shift said digital representations in response to control inputs from said serial bus, said sample register having a serial data output;
- shifting out said digital representations from said sample register;
- counting the number of shifting operations performed in said sample register;
- reloading said sample register with the next one of said digital representations after the number of shifting operations reaches a predetermined count, responsive to control inputs from said serial bus; and
- receiving and storing the serial data output from said sample register.

18. The method of claim 17, further comprising the step of selectively controlling the loading of said digital representations into said sample register using a load data multiplexer.

19. The method of claim 17, further comprising the step of loading a single parallel flow of said digital representations into said sample register.

20. The method of claim 19, further comprising the step of selectively compressing multiple parallel flows of said digital representations into said sample register.

21. The method of claim 17, further comprising the steps of storing a plurality of test programs in a memory and storing a plurality of digital representations from said sample register in said memory.

22. The method of claim 21, further comprising the steps of executing a plurality of said test programs in a processor and receiving a plurality of test data inputs in response, said processor subsequently being used to test the plurality of received test data inputs to determine if the received test data inputs fall within an anticipated range.

23. A test system for testing an analog circuit, comprising;

a transmitter circuit associated with an analog circuit to be tested and operable to receive and measure analog signal input from the analog circuit for translating a plurality of individual analog signal measurements into a plurality of associated individual digital representations and for continuously outputting a plurality of packets of said digital representations in a serial bit format;

a receiver circuit coupled to said transmitter circuit for continuously receiving a plurality of said digital representations in said serial bit format from said transmitter circuit, for storing each received serial bit format into a memory, and for processing the stored plurality of serial bit formats of said digital representations of said analog signal measurements for testing of the analog circuit; and further comprising circuitry for coupling said receiver circuit to a plurality of ones of said transmitter circuit.

24. The test system of claim 23, further comprising a serial bus for coupling said transmitter circuit to at least one of a plurality of ones of said receiver circuit.

25. The test system of claim 23, wherein said transmitter circuit comprises an integrated circuit.

26. The test system of claim 23, wherein said transmitter circuit comprises a sub-circuit within an integrated circuit.

* * * * *